US 11,961,816 B2
Apr. 16, 2024

(12) United States Patent
Takei et al.

(54) SEMICONDUCTOR CHIP AND SEMICONDUCTOR DEVICE INCLUDING A COPPER PILLAR AND AN INTERMEDIATE LAYER AND A CONCAVE PORTION FORMED AT ONE END SURFACE OF THE COPPER PILLAR

(71) Applicant: ROHM CO., LTD., Kyoto (JP)

(72) Inventors: Shoji Takei, Kyoto (JP); Yuji Koga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/860,291

(22) Filed: Jul. 8, 2022

(65) Prior Publication Data

US 2022/0344299 A1 Oct. 27, 2022

Related U.S. Application Data

(63) Continuation of application No. 16/832,946, filed on Mar. 27, 2020, now Pat. No. 11,417,623.

(30) Foreign Application Priority Data

Mar. 29, 2019 (JP) ................................. 2019-068474

(51) Int. Cl.
| | |
|---|---|
| *H01L 23/31* | (2006.01) |
| *H01L 23/00* | (2006.01) |
| *H01L 23/532* | (2006.01) |

(52) U.S. Cl.
CPC .......... *H01L 24/29* (2013.01); *H01L 23/3114* (2013.01); *H01L 23/53228* (2013.01);
(Continued)

(58) Field of Classification Search
CPC ......... H01L 24/11; H01L 24/13; H01L 24/17; H01L 24/29; H01L 24/81;
(Continued)

(56) References Cited

U.S. PATENT DOCUMENTS

| | | | |
|---|---|---|---|
| 8,957,524 B2 | 2/2015 | Breuer et al. | |
| 9,559,075 B1 * | 1/2017 | Baloglu | .................. H01L 24/05 |

(Continued)

FOREIGN PATENT DOCUMENTS

| | | |
|---|---|---|
| CN | 1414630 A | 4/2003 |
| CN | 103123917 A | 5/2013 |

(Continued)

OTHER PUBLICATIONS

Japanese Office Action dated Jan. 12, 2023, in the counterpart of Japanese patent application No. 2019-068474.
(Continued)

*Primary Examiner* — Khiem D Nguyen
(74) *Attorney, Agent, or Firm* — Rabin & Berdo, P.C.

(57) ABSTRACT

A semiconductor device includes a semiconductor layer having a first surface, an insulating layer formed at the first surface of the semiconductor layer, a Cu conductive layer formed on the insulating layer, the Cu conductive layer made of a metal mainly containing Cu, a second insulating layer formed on the insulating layer, the second insulating layer covering the Cu conductive layer, a Cu pillar extending in a thickness direction in the second insulating layer, the Cu pillar made of a metal mainly containing Cu and electrically connected to the Cu conductive layer, and an intermediate layer formed between the Cu conductive layer and the Cu pillar, the intermediate layer made of a material having a linear expansion coefficient smaller than a linear expansion coefficient of the Cu conductive layer and smaller than a linear expansion coefficient of the Cu pillar.

25 Claims, 29 Drawing Sheets

(52) U.S. Cl.
CPC .............. *H01L 2224/29155* (2013.01); *H01L 2924/18161* (2013.01)

(58) Field of Classification Search
CPC . H01L 2224/29155; H01L 2224/05164; H01L 2224/05166; H01L 2224/05186; H01L 2224/1146; H01L 2224/131; H01L 2224/02166; H01L 2224/02116; H01L 23/488; H01L 23/49541; H01L 23/53228; H01L 2224/13147; H01L 2924/00014; H01L 2224/0401; H01L 23/3114; H01L 23/49562; H01L 23/49548; H01L 23/49572
USPC ........................................................ 257/782
See application file for complete search history.

(56) References Cited

U.S. PATENT DOCUMENTS

| | | | |
|---|---|---|---|
| 9,735,124 B2* | 8/2017 | Chen | H01L 24/11 |
| 9,972,505 B2 | 5/2018 | Matsumoto et al. | |
| 10,036,707 B2* | 7/2018 | Zhao | G01J 3/28 |
| 11,417,623 B2* | 8/2022 | Takei | H01L 24/11 |
| 2002/0043723 A1 | 4/2002 | Shimizu | |
| 2003/0080422 A1 | 5/2003 | Ohara | |
| 2004/0060970 A1* | 4/2004 | Moon | H01L 24/11 |
| | | | 257/E23.021 |
| 2009/0206476 A1 | 8/2009 | Su | |
| 2010/0164105 A1 | 7/2010 | Onai et al. | |
| 2010/0264514 A1 | 10/2010 | Iwamoto et al. | |
| 2012/0126368 A1 | 5/2012 | Chan et al. | |
| 2012/0280385 A1 | 11/2012 | Tain et al. | |
| 2013/0168874 A1 | 7/2013 | Scanlan | |
| 2014/0061704 A1 | 3/2014 | Yamada et al. | |
| 2014/0131862 A1* | 5/2014 | Kuo | H01L 24/06 |
| | | | 257/737 |
| 2015/0014848 A1 | 1/2015 | Lin et al. | |
| 2015/0162456 A1 | 6/2015 | Toyama | |
| 2015/0228606 A1 | 8/2015 | Chen et al. | |
| 2015/0263279 A1 | 9/2015 | Hayakawa et al. | |
| 2016/0027747 A1 | 1/2016 | Ryu et al. | |
| 2016/0336277 A1 | 11/2016 | Kageyama et al. | |
| 2018/0047691 A1* | 2/2018 | Utsunomiya | H01L 24/13 |
| 2018/0053741 A1* | 2/2018 | Chang | H01L 24/11 |
| 2018/0090461 A1* | 3/2018 | Tanaka | H01L 24/05 |
| 2018/0138138 A1* | 5/2018 | Hames | H01L 24/03 |
| 2019/0164920 A1* | 5/2019 | Tsao | H01L 24/13 |
| 2019/0259722 A1 | 8/2019 | Pokhrel et al. | |
| 2019/0371695 A1 | 12/2019 | Hatano et al. | |
| 2019/0378796 A1 | 12/2019 | Iwamoto et al. | |

FOREIGN PATENT DOCUMENTS

| | | |
|---|---|---|
| CN | 107546213 A | 1/2018 |
| JP | 2001053075 A | 2/2001 |
| JP | 2010171386 A | 8/2010 |
| JP | 2017034187 A | 2/2017 |
| JP | 2018006391 A | 1/2018 |
| JP | 2018061018 A | 4/2018 |
| JP | 2018081979 A | 5/2018 |

OTHER PUBLICATIONS

Chinese Office Action dated May 17, 2023, in the counterpart Chinese Patent Application No. 202010232272X.
Chinese Office Action dated Oct. 19, 2023, in the counterpart Chinese Patent Application No. 202010232272X.
Chinese Office Action dated Feb. 18, 2023, in the counterpart Chinese Patent Application No. 202010232272X.

* cited by examiner

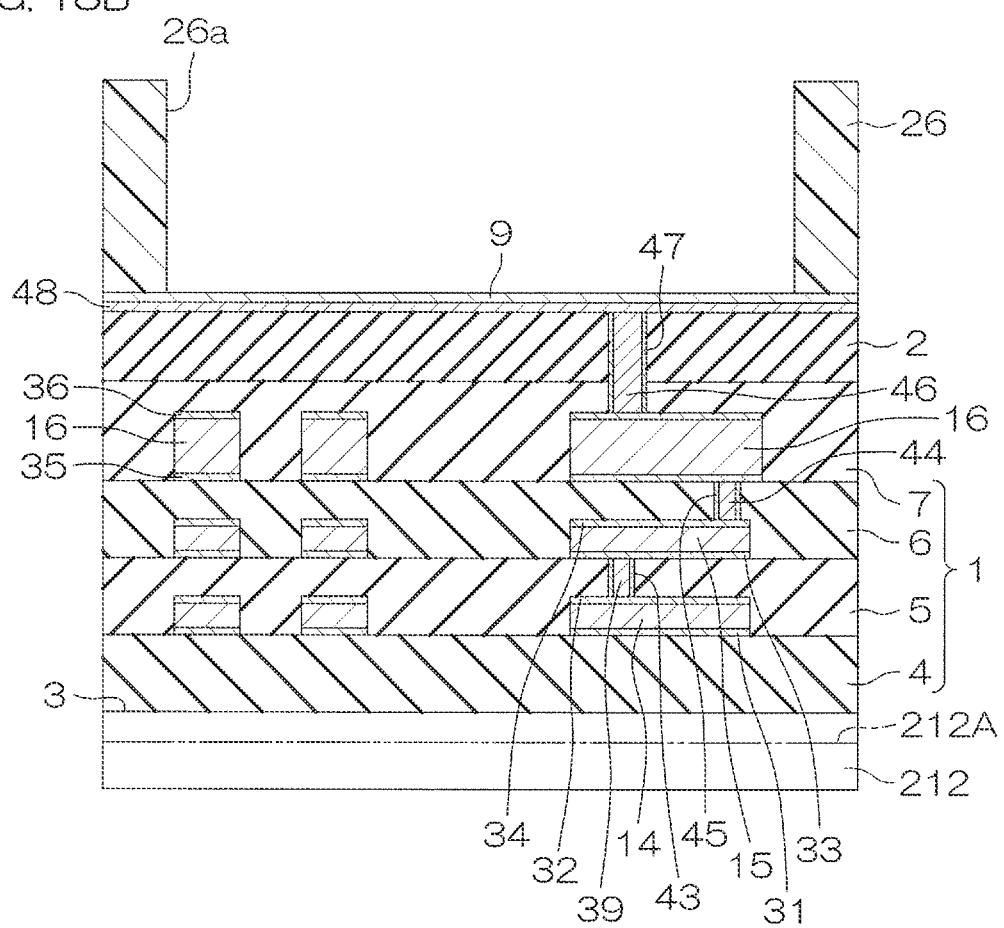

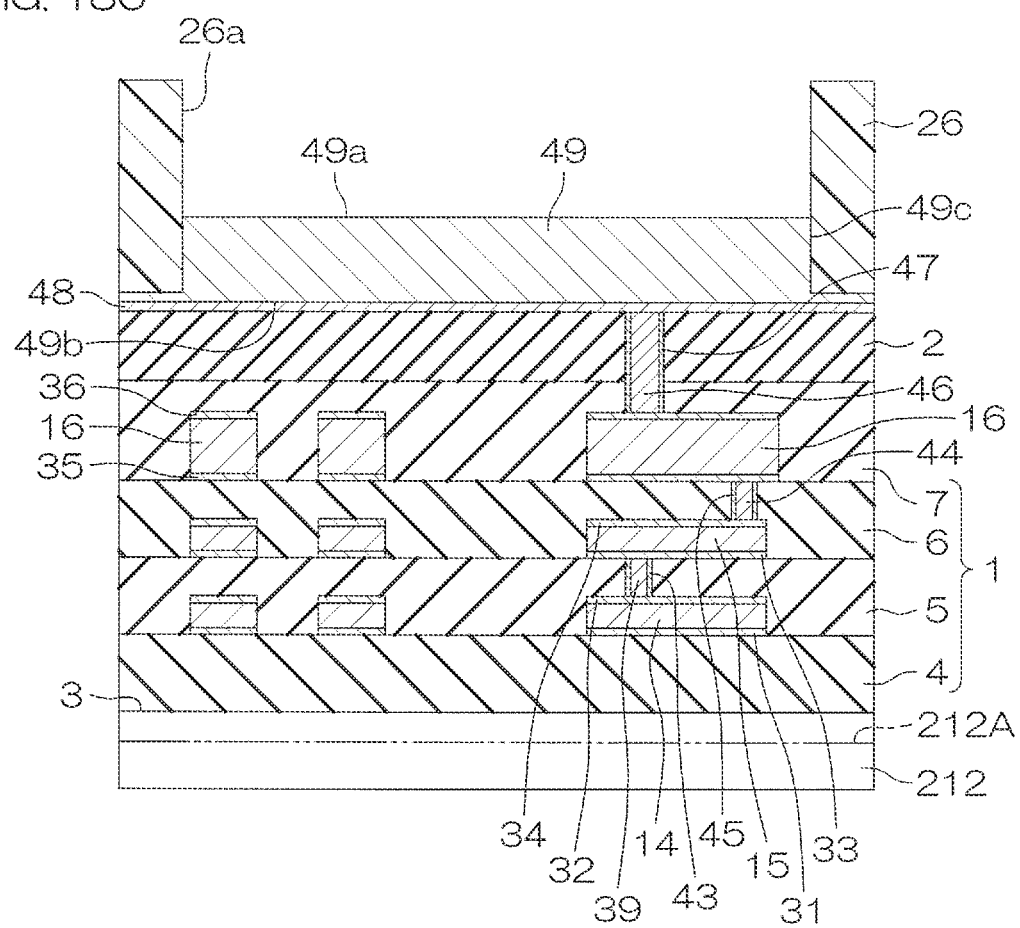

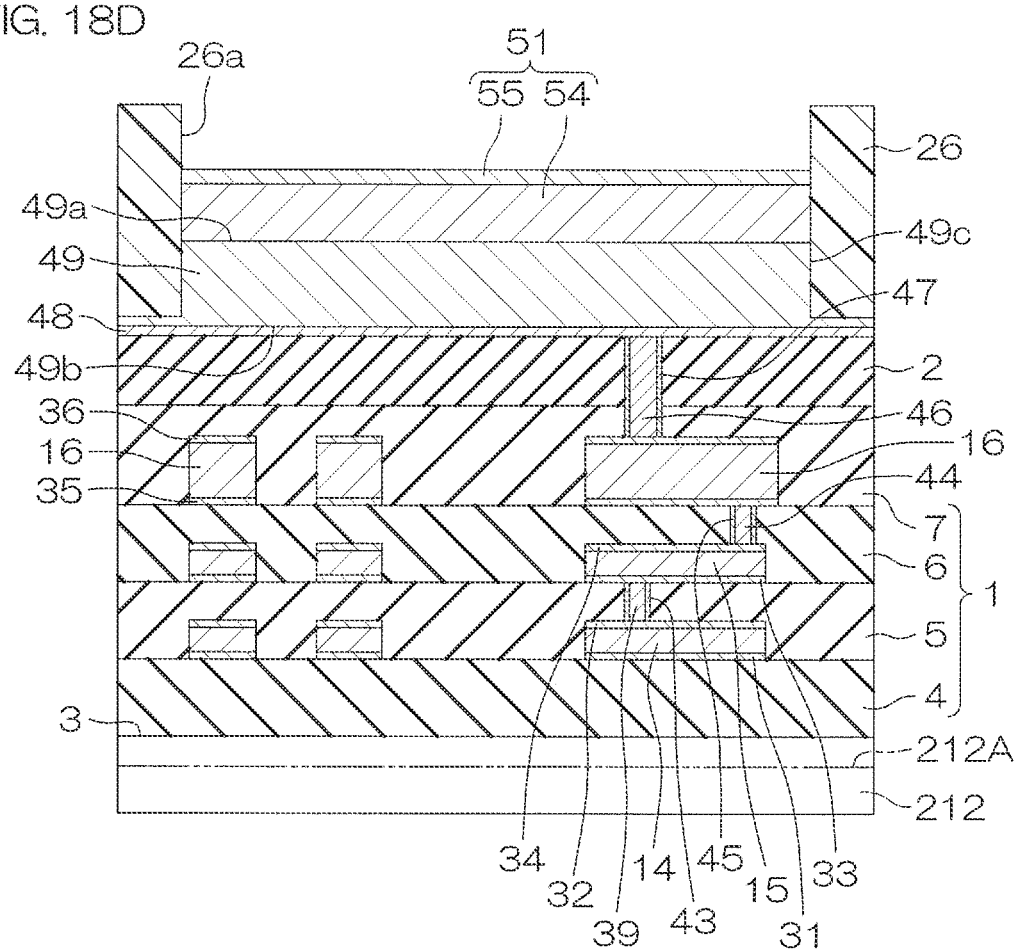

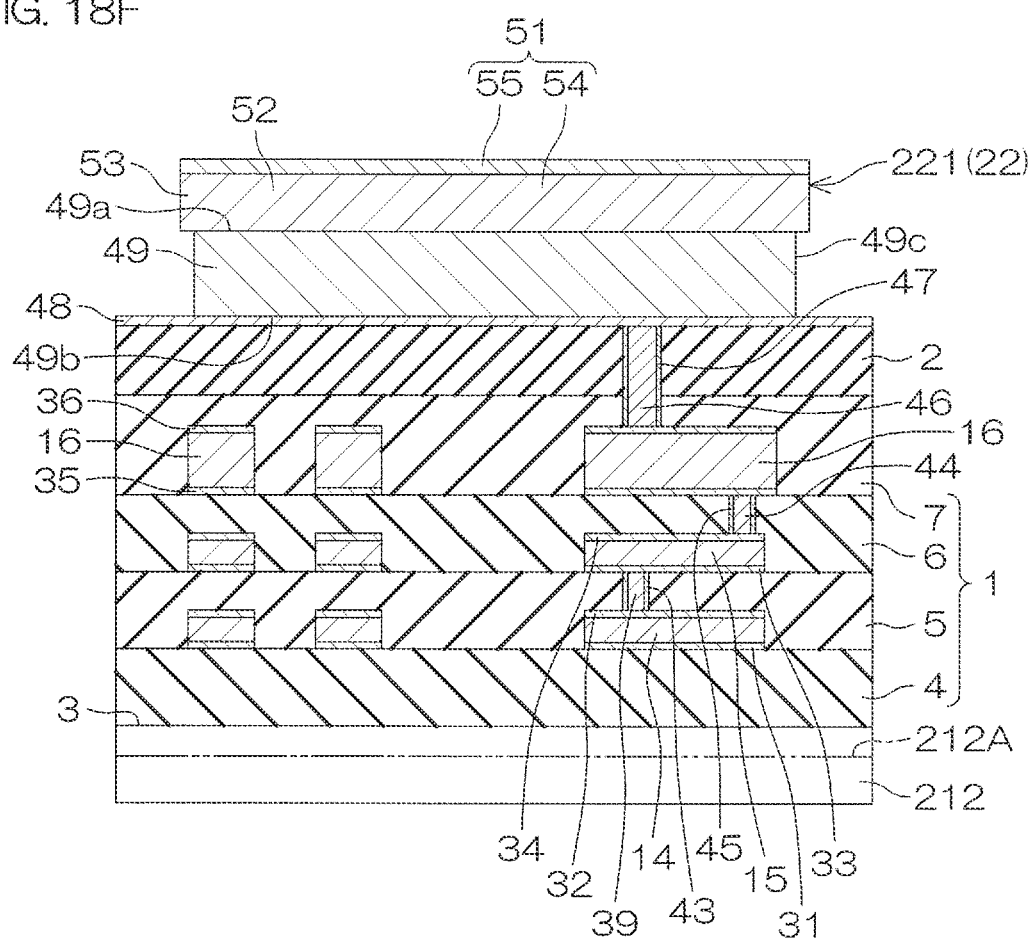

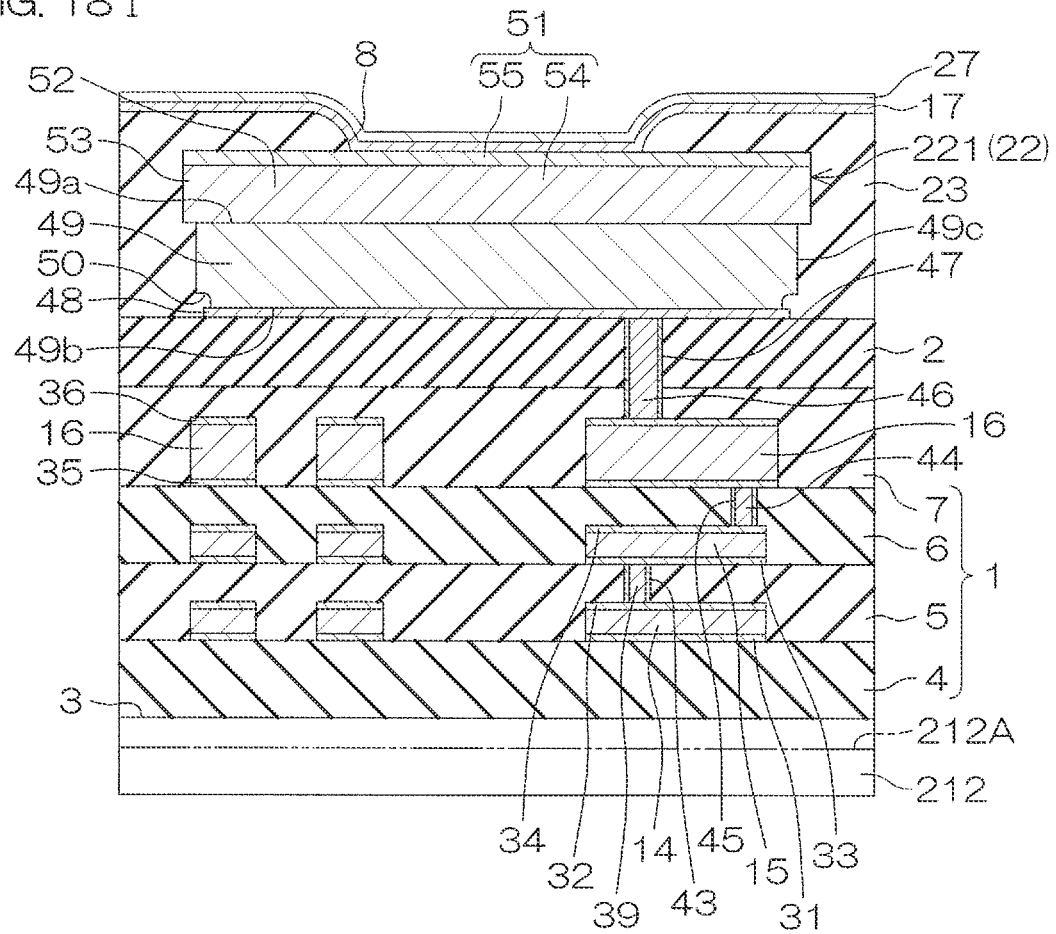

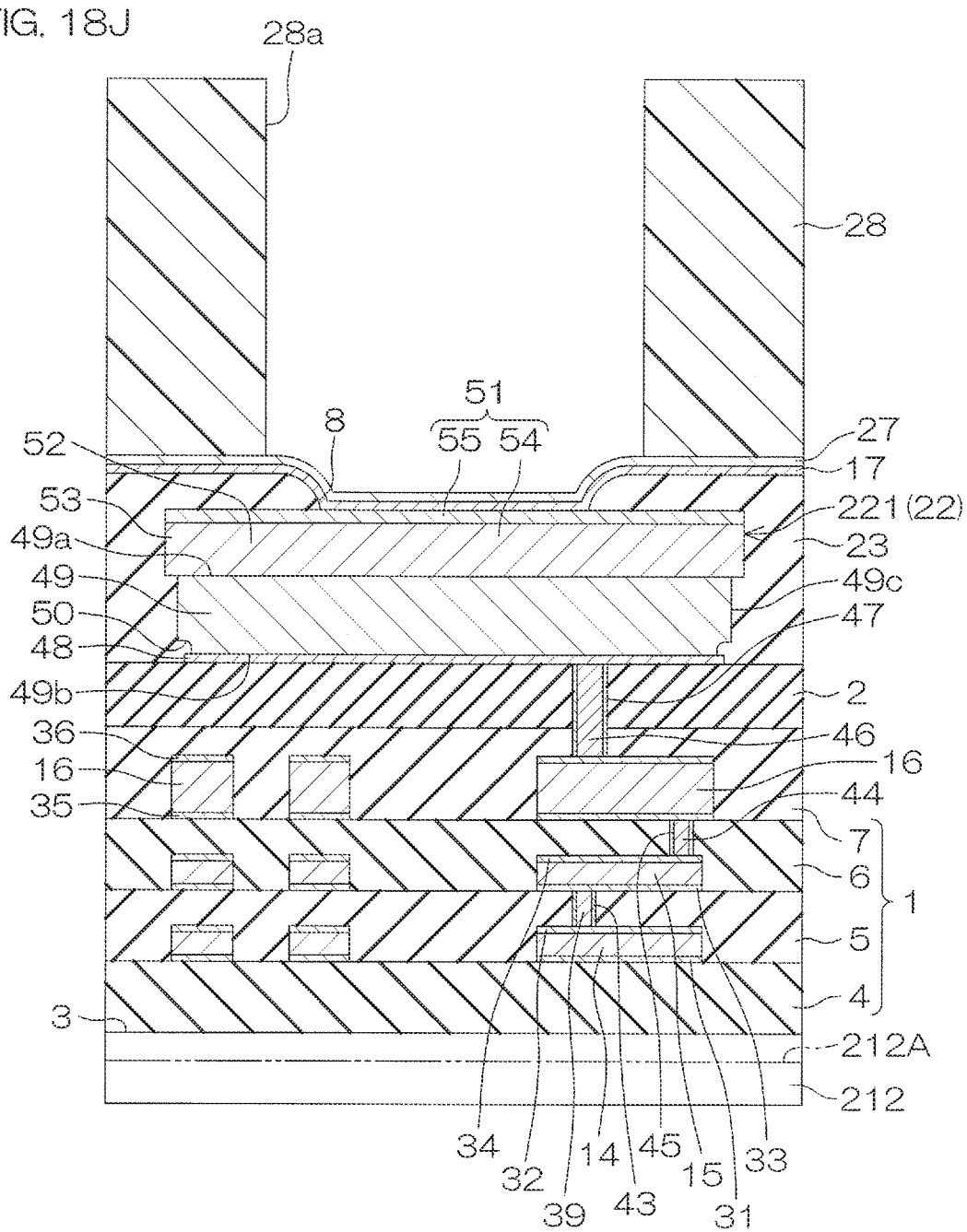

SEMICONDUCTOR CHIP AND SEMICONDUCTOR DEVICE INCLUDING A COPPER PILLAR AND AN INTERMEDIATE LAYER AND A CONCAVE PORTION FORMED AT ONE END SURFACE OF THE COPPER PILLAR

CROSS-REFERENCE TO RELATED APPLICATIONS

This application is a continuation of application Ser. No. 16/832,946 filed on Mar. 27, 2020 issued as U.S. Pat. No. 11,417,623. Further, this application corresponds to Japanese Patent Application No. 2019-068474 filed in the Japan Patent Office on Mar. 29, 2019, and the entire disclosure of the application is incorporated herein by reference.

TECHNICAL FIELD

The present invention relates to a semiconductor device and a semiconductor package that includes the semiconductor device.

BACKGROUND ART

Patent Literature 1 (Japanese Patent Application Publication No. 2010-171386) discloses a semiconductor device that is made of a semiconductor substrate, a Cu wiring formed on the semiconductor substrate, a plated layer with which a surface and a side surface of the Cu wiring are covered, and a Cu wire that has been wire-bonded onto the Cu wiring through the plated layer. The plated layer has an Ni/Pd/Au laminated structure.

A manufacturing process of the semiconductor device includes, for example, a step of forming the Cu wiring through a barrier metal film on an insulating film with which the semiconductor substrate is covered. The barrier metal film includes a Ti/Cu seed layer formed according to a sputtering method. The Cu wiring is formed on the barrier metal film while using a resist film on the barrier metal film as a mask according to an electrolytic plating method. After completing the plating of the Cu wiring, the resist film is removed, and the Ti/Cu seed layer exposed by removing the resist film is removed by wet etching. For example, the Cu seed layer is first removed by a mixed liquid consisting of hydrogen peroxide water and nitric acid, and then a Ti film is removed by a mixed liquid consisting of hydrogen peroxide water and ammonia.

SUMMARY OF INVENTION

An object of the present invention is to provide a semiconductor device that is capable of reducing stress generated when it is mounted by use of a Cu pillar on a Cu conductive layer and to provide a semiconductor package that includes the semiconductor device.

A semiconductor device according to an aspect of the present invention includes a semiconductor layer having a first surface, an insulating layer formed at the first surface of the semiconductor layer, a Cu conductive layer formed on the insulating layer, the Cu conductive layer made of a metal mainly containing Cu, a second insulating layer formed on the insulating layer, the second insulating layer covering the Cu conductive layer, a Cu pillar extending in a thickness direction in the second insulating layer, the Cu pillar made of a metal mainly containing Cu and that is electrically connected to the Cu conductive layer, and an intermediate layer formed between the Cu conductive layer and the Cu pillar, the intermediate layer made of a material having a linear expansion coefficient smaller than a linear expansion coefficient of the Cu conductive layer and smaller than a linear expansion coefficient of the Cu pillar.

A semiconductor package according to an aspect of the present invention includes a conductive member having a first surface and a second surface on the opposite side of the first surface, the semiconductor device that is flip-chip bonded to the first surface of the conductive member, and a sealing resin with which a part of the conductive member and the semiconductor device are covered.

Effects of Invention

According to the semiconductor device and the semiconductor package according to an aspect of the present invention, the intermediate layer made of a material having a linear expansion coefficient smaller than a linear expansion coefficient of the Cu conductive layer and smaller than a linear expansion coefficient of the Cu pillar is formed between the Cu conductive layer and the Cu pillar. This makes it possible to reduce stress generated when the semiconductor device is packaged by use of the Cu pillar. Particularly when the semiconductor device is flip-chip packaged on the conductive member, stress is easily received, and therefore an excellent advantageous effect is fulfilled in flip chip packaging. Therefore, it is possible to provide a semiconductor package that is superior in reliability.

DESCRIPTION OF EMBODIMENTS

Preferred Embodiments of the Present Invention

Figure 1:
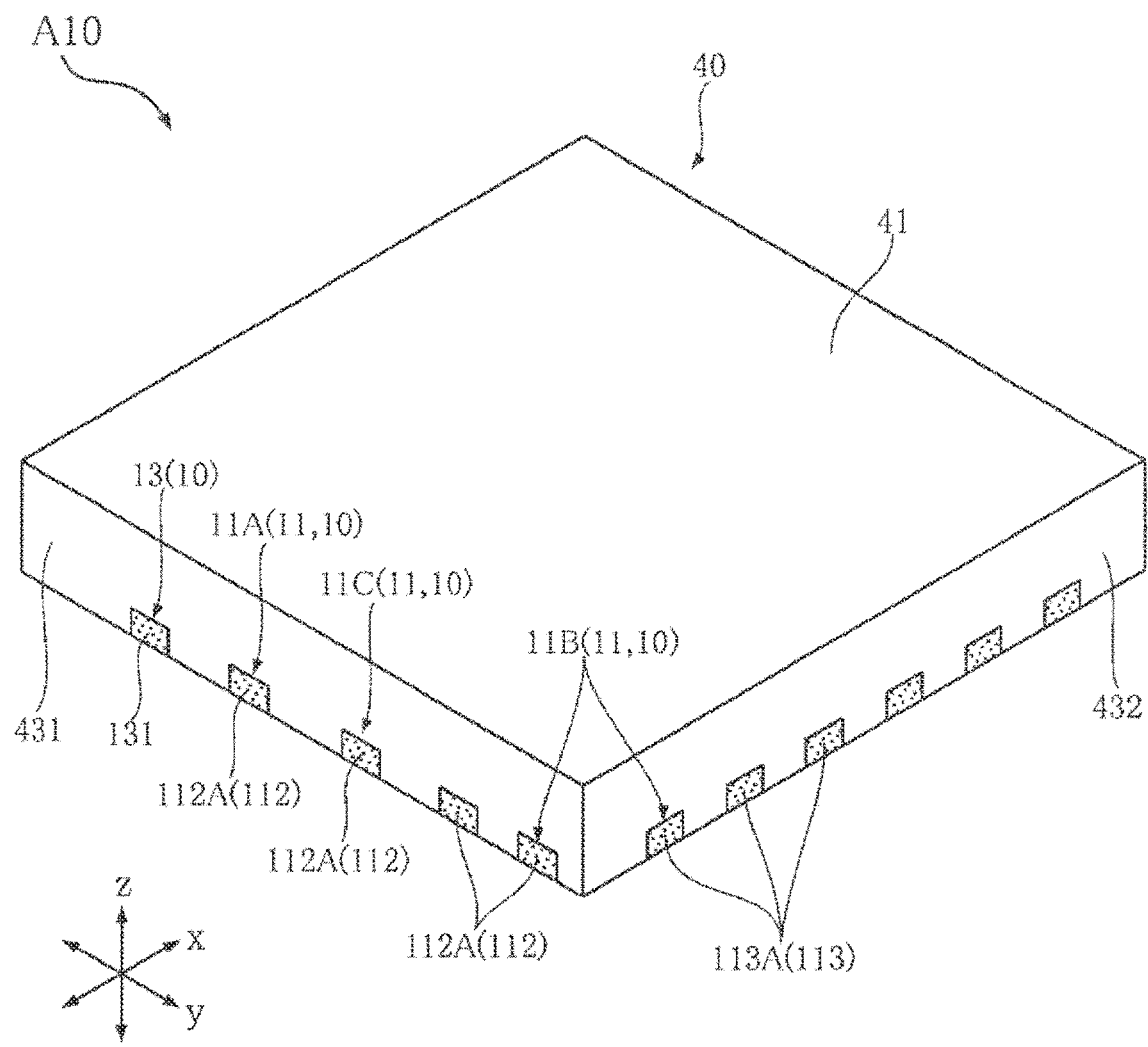
FIG. 1 is a perspective view of a semiconductor package according to a first preferred embodiment of the present invention.

First, preferred embodiments of the present invention will be described in itemized form.

A semiconductor device according to a preferred embodiment of the present invention includes a semiconductor layer having a first surface, an insulating layer formed at the first surface of the semiconductor layer, a Cu conductive layer formed on the insulating layer, the Cu conductive layer made of a metal mainly containing Cu, a second insulating layer formed on the insulating layer, the second insulating layer covering the Cu conductive layer, a Cu pillar extending in a thickness direction in the second insulating layer, the Cu pillar made of a metal mainly containing Cu and electrically connected to the Cu conductive layer, and an intermediate layer formed between the Cu conductive layer and the Cu pillar, the intermediate layer made of a material having a linear expansion coefficient smaller than a linear expansion coefficient of the Cu conductive layer and smaller than a linear expansion coefficient of the Cu pillar.

According to this arrangement, the intermediate layer made of a material having a linear expansion coefficient smaller than the linear expansion coefficient of the Cu conductive layer and smaller than the linear expansion coefficient of the Cu pillar is formed between the Cu conductive layer and the Cu pillar. This makes it possible to reduce stress generated when the semiconductor device is packaged by use of the Cu pillar.

In the semiconductor device according to a preferred embodiment of the present invention, the linear expansion coefficient of the Cu conductive layer and the linear expansion coefficient of the Cu pillar may be each 16.0 to 18.0 ($10^{-6}/°$ C.), and the linear expansion coefficient of the intermediate layer may be 10.0 to 15.0 ($10^{-6}/°$ C.).

In the semiconductor device according to a preferred embodiment of the present invention, the intermediate layer may include a laminated structure including a first intermediate layer and a second intermediate layer that are laminated in this order from the Cu conductive layer, and the first intermediate layer may have a linear expansion coefficient larger than a linear expansion coefficient of the second intermediate layer, and may have a thickness larger than a thickness of the second intermediate layer.

In the semiconductor device according to a preferred embodiment of the present invention, the first intermediate layer may include an Ni layer, and the second intermediate layer may include a Pd layer.

In the semiconductor device according to a preferred embodiment of the present invention, the Cu pillar may have a thickness of 20 μm to 60 μm.

In the semiconductor device according to a preferred embodiment of the present invention, the Cu conductive layer may have a thickness of 2 μm to 6 μm.

The semiconductor device according to a preferred embodiment of the present invention may further include a bonding layer for external connection formed on the Cu pillar, and the bonding layer may have a layer made of a material having a linear expansion coefficient smaller than the linear expansion coefficient of the Cu pillar at a part that is contiguous to the Cu pillar.

In the semiconductor device according to a preferred embodiment of the present invention, the bonding layer may include an external bonding layer that is used for flip chip bonding.

In the semiconductor device according to a preferred embodiment of the present invention, the bonding layer may include a first layer that is formed on the Cu pillar and that is made of a metal mainly containing Ni and a second layer that is formed on the first layer and that is made of a metal mainly containing solder, and the second layer may be used for external connection.

In the semiconductor device according to a preferred embodiment of the present invention, the second layer may be formed in a substantially spherical shape.

The semiconductor device according to a preferred embodiment of the present invention may include a barrier layer formed between the insulating layer and the Cu conductive layer, and the Cu conductive layer may have a first surface and a second surface that is contiguous to the barrier layer, and a circumferential edge on the second-surface side of the Cu conductive layer may be away from a circumferential edge of the barrier layer toward an inward side of the barrier layer.

A semiconductor package according to a preferred embodiment of the present invention includes a conductive member having a first surface and a second surface on the opposite side of the first surface, the semiconductor device that is flip-chip bonded to the first surface of the conductive member, and a sealing resin covering a part of the conductive member and the semiconductor device.

According to this arrangement, the intermediate layer made of a material having a linear expansion coefficient smaller than the linear expansion coefficient of the Cu conductive layer and smaller than the linear expansion coefficient of the Cu pillar is formed between the Cu conductive layer and the Cu pillar. This makes it possible to reduce stress generated when the semiconductor device is packaged by use of the Cu pillar. Particularly when the semiconductor device is flip-chip packaged on the conductive member, stress is easily received, and therefore an excellent advantageous effect is fulfilled in flip chip packaging. Therefore, it is possible to provide a semiconductor package that is superior in reliability.

A semiconductor package according to another preferred embodiment of the present invention includes a conductive member having a first surface and a second surface on the opposite side of the first surface, the semiconductor device that is mounted on the first surface of the conductive member and in which the Cu pillar is connected to the first surface of the conductive member, and a sealing resin covering a part of the conductive member and the semiconductor device.

A semiconductor package according to another preferred embodiment of the present invention includes a conductive member having a first surface and a second surface on the opposite side of the first surface, the semiconductor device that is mounted on the first surface of the conductive member and in which the Cu pillar is connected to the first surface of the conductive member, a bonding material that is formed between the conductive member and the Cu pillar and that is made of a metal mainly containing solder, and a sealing resin covering a part of the conductive member, the semiconductor device, and the bonding material.

In the semiconductor package according to one other preferred embodiment of the present invention, a part of the Cu pillar may be buried in the bonding material.

DETAILED DESCRIPTION OF PREFERRED EMBODIMENTS OF THE PRESENT INVENTION

Next, preferred embodiments of the present invention will be described in detail with reference to the accompanying drawings.

A semiconductor package A10 according to a first preferred embodiment of the present invention will be described with reference to FIG. 1 to FIG. 16.

The semiconductor package A10 is made of a conductive member 10, a semiconductor device 20, a bonding layer 30, and a sealing resin 40. The package form of the semiconductor package A10 is QFN (Quad For Non-Lead Package) as shown in FIG. 1. The semiconductor device 20 is a flip-chip-type LSI. The semiconductor device 20 is provided with a switching circuit 212A and a control circuit 212B (both of which will be described in detail later) arranged in its inside.

Figure 2:
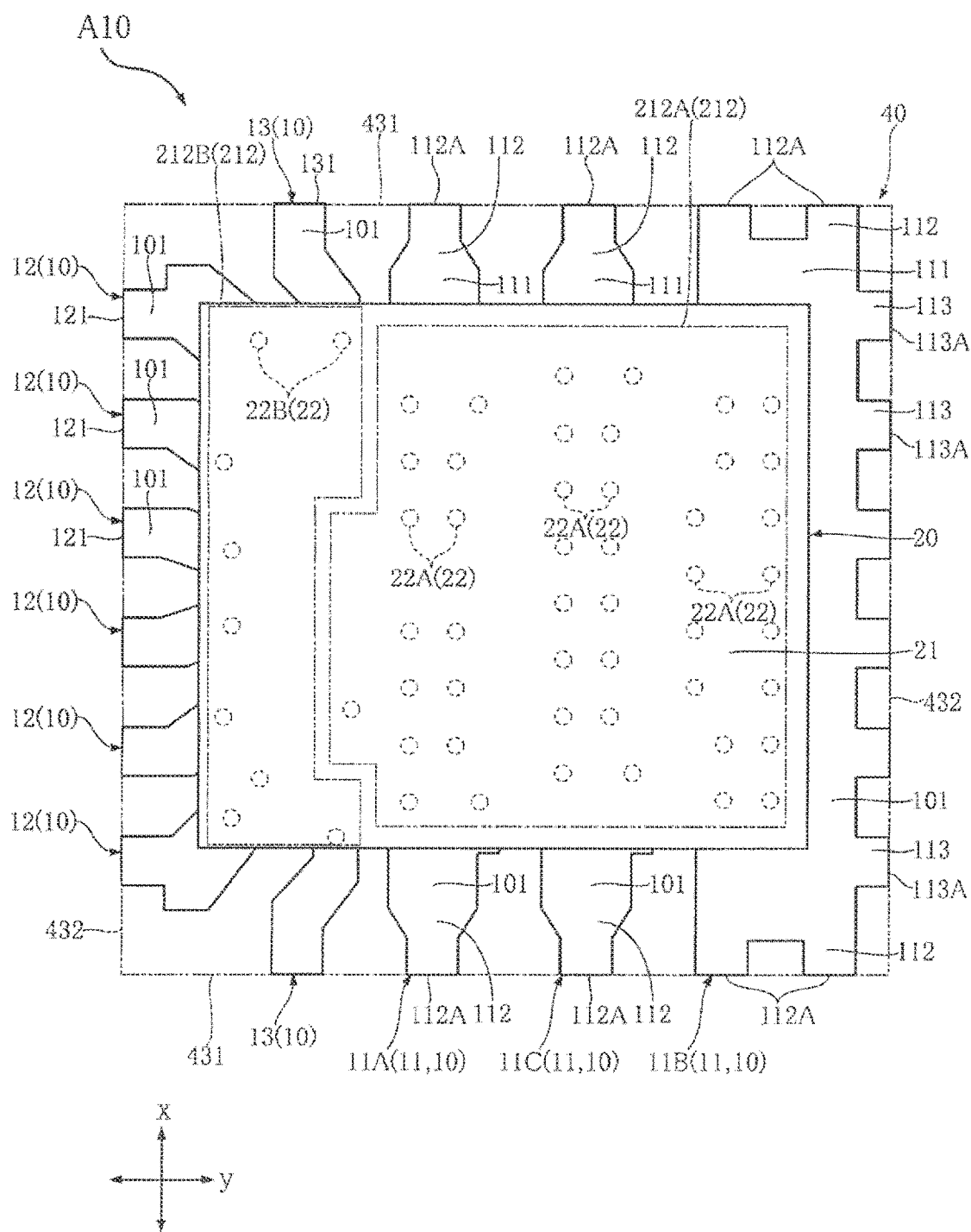
FIG. 2 is a plan view (seen through a sealing resin) of the semiconductor package shown in FIG. 1.
Figure 3:
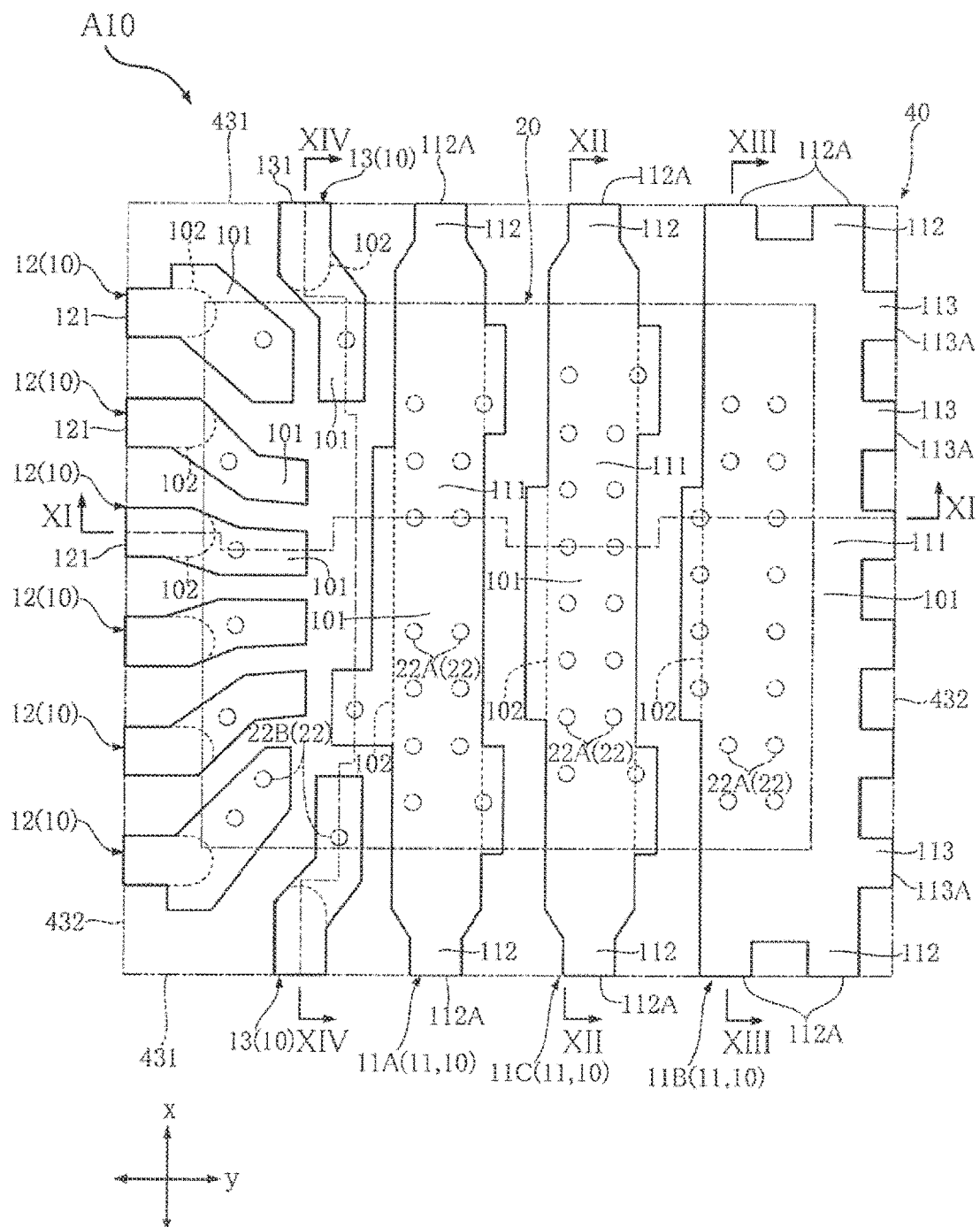
FIG. 3 is a plan view (seen through a semiconductor element and through a sealing resin) of the semiconductor package shown in FIG. 1.

In the semiconductor package A10, direct-current power (voltage) is converted into alternating-current power (voltage) by the switching circuit 212A. The semiconductor package A10 is used for one element that forms a circuit of, for example, a DC/DC converter. Herein, for convenience of understanding, FIG. 2 shows a view seen through the sealing resin 40. For convenience of understanding, FIG. 3 shows a view seen through the semiconductor device 20 and through the sealing resin 40. In these drawings, the semiconductor device 20 and the sealing resin 40 through both of which a view is seen are each represented by an imaginary line (an alternate long and two short dashed line).

When the semiconductor package A10 is described, a thickness direction Z of the conductive member 10 is referred to as a "thickness direction Z." A direction perpendicular to the thickness direction Z is referred to as a "first direction x." A direction perpendicular to both the thickness direction Z and the first direction x is referred to as a "second direction y."

The semiconductor package A10 is formed in a square shape when seen along the thickness direction Z as shown in FIG. 1 and FIG. 2. For convenience, when the semiconductor package A10 is described, a side on which a plurality of second leads 12 (described in detail later) are positioned in the second direction y is referred to as a "one side in the second direction y." A side on which a plurality of first leads 11 (described in detail later) are positioned in the second direction y is referred to as an "other side in the second direction y."

The conductive member 10 supports the semiconductor device 20 and serves as a terminal to mount the semiconductor package A10 on a wiring board as shown in FIG. 2. The conductive member 10 has its part covered with the sealing resin 40 as shown in FIG. 11 to FIG. 14. The conductive member 10 has a principal surface 101 (first surface) and a rear surface 102 (second surface) both of which face mutually-opposite sides in the thickness direction Z. The principal surface 101 is directed toward one side in the thickness direction Z, and faces the semiconductor device 20.

The semiconductor device 20 is supported by the principal surface 101. The principal surface 101 is covered with the sealing resin 40. The rear surface 102 is directed toward the other side in the thickness direction Z. The conductive member 10 is made of a single lead frame. A material of which the lead frame is made is, for example, copper (Cu) or a copper alloy. The conductive member 10 includes a plurality of first leads 11, a plurality of second leads 12, and a pair of third leads 13.

Figure 4:
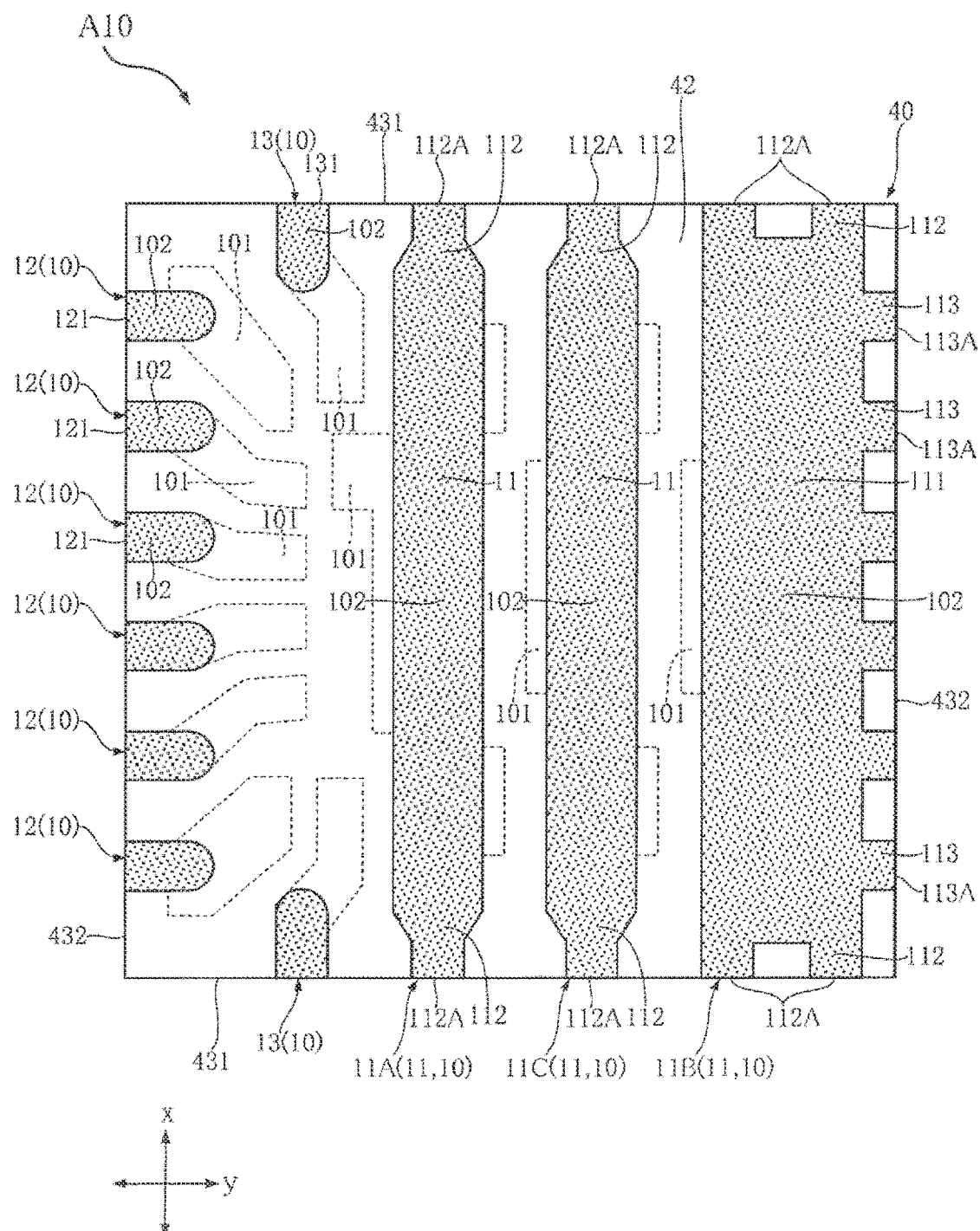
FIG. 4 is a bottom view of the semiconductor package shown in FIG. 1.

The first leads 11 are each formed in a belt shape that extends in the second direction y when seen along the thickness direction Z as shown in FIG. 3 and FIG. 4. The first leads 11 are arranged along the second direction y. In an example shown by the semiconductor package A10, the first leads 11 consist of three terminals, i.e., consist of a first input terminal 11A, a second input terminal 11B, and an output terminal 11C.

The first input terminal 11A, the output terminal 11C, and the second input terminal 11B are arranged in this order from the one side toward the other side in the second direction y in the first leads 11. In the first input terminal 11A and the second input terminal 11B, direct-current power (voltage) that is to be subjected to power conversion in the semiconductor package A10 is input. The first input terminal 11A is a positive electrode (P terminal). The second input terminal 11B is a negative electrode (N terminal). In the output terminal 11C, alternating-current power (voltage) that has been subjected to power conversion by the switching circuit 212A formed in the semiconductor device 20 is output.

The first input terminal 11A is positioned between the second leads 12 and the output terminal 11C in the second direction y as shown in FIG. 3. The output terminal 11C is positioned between the first input terminal 11A and the second input terminal 11B in the second direction y. The first input terminal 11A and the output terminal 11C each include a main portion 111 and a pair of side portions 112. The main portion 111 extends in the first direction x as shown in FIG. 3 and FIG. 4. In the first leads 11, the semiconductor device 20 is supported by the principal surface 101 of the main portion 111.

The pair of side portions 112 are continuous with both ends in the first direction x of the main portion 111. Each of the pair of side portions 112 has a first end surface 112A as shown in FIG. 3, FIG. 4, FIG. 12, and FIG. 13. The first end surface 112A is continuous with both the principal surface 101 and the rear surface 102 of the first lead 11, and is directed in the first direction x. The first end surface 112A is exposed from the sealing resin 40.

Figure 9:
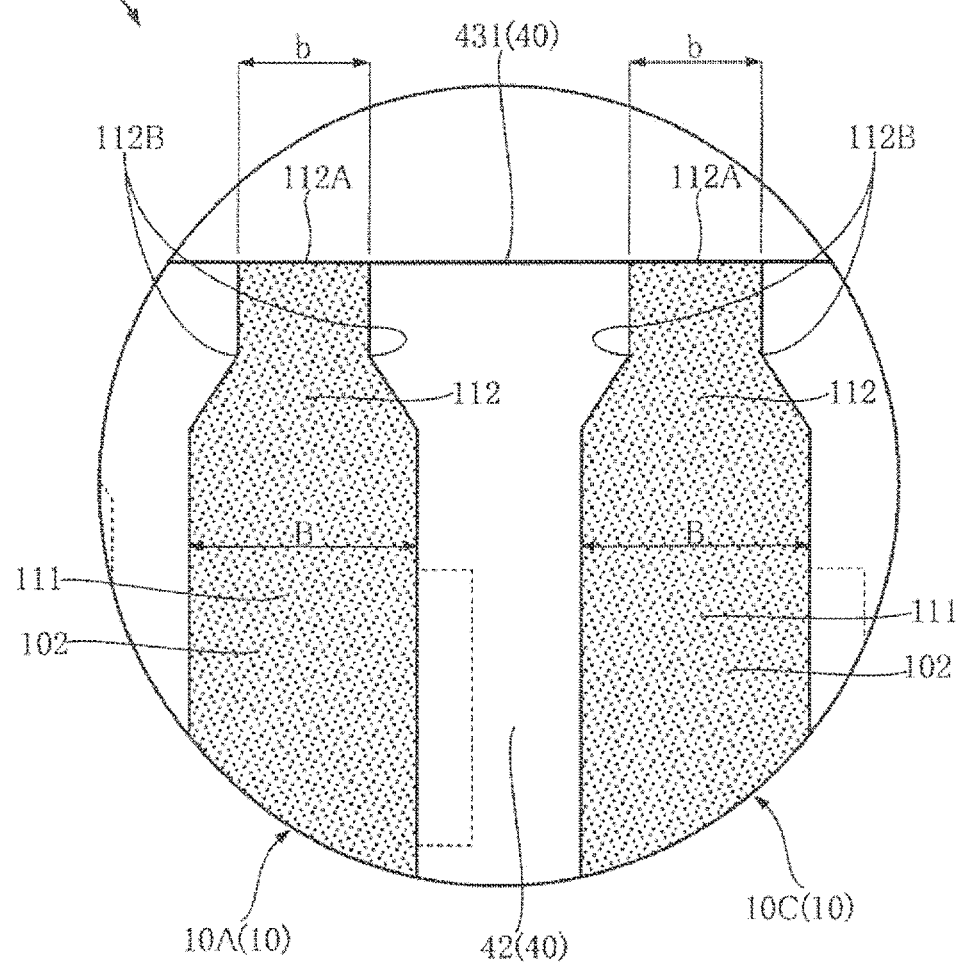
FIG. 9 is a partially enlarged view of FIG. 3.

A constricted portion 112B is formed at each of the pair of side portions 112 of the first input terminal 11A and of the output terminal 11C as shown in FIG. 9. The constricted portion 112B reaches the rear surface 102 from the principal surface 101 of the first lead 11, and is concaved from both sides in the second direction y toward the inward side of the side portion 112. The constricted portion 112B is contiguous to the sealing resin 40. In the first input terminal 11A and the output terminal 11C, the size b in the second direction y of each of the pair of first end surfaces 112A becomes smaller than the size B in the second direction y of the rear surface 102 of the main portion 111 because of the constricted portion 112B.

The second input terminal 11B is positioned closer to the other side in the second direction y than the output terminal 11C as shown in FIG. 3. Therefore, the second input terminal 11B is positioned on the other side in the second direction y among the first leads 11. The second input terminal 11B includes the main portion 111, the pair of side portions 112, and a plurality of projection portions 113.

Figure 7:
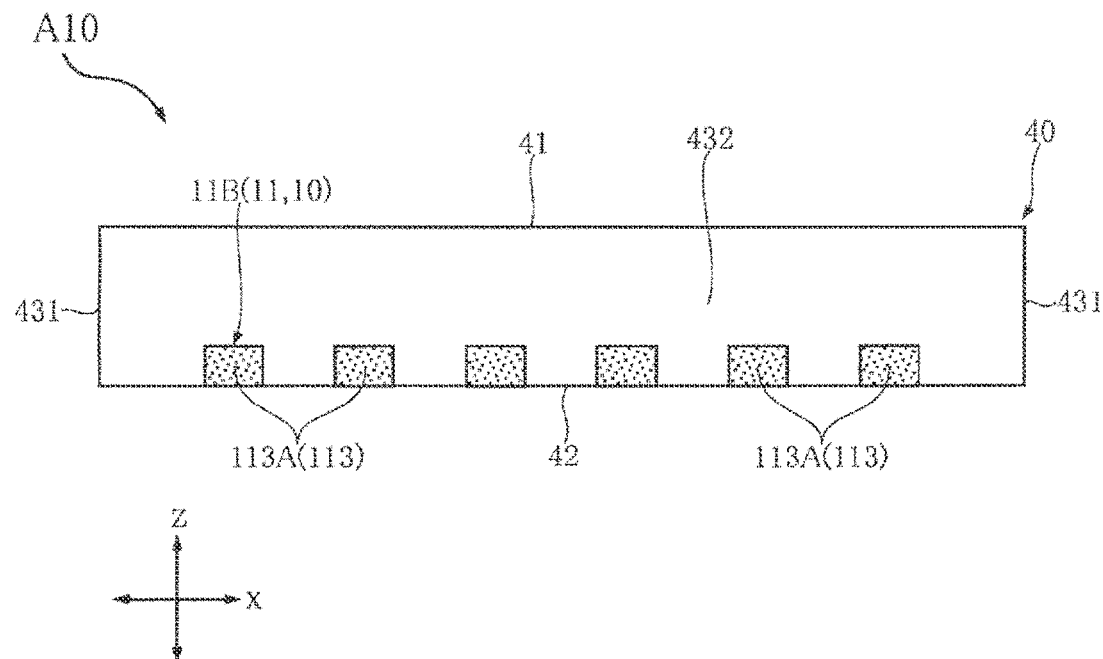
FIG. 7 is a right side view of the semiconductor package shown in FIG. 1.
Figure 12:
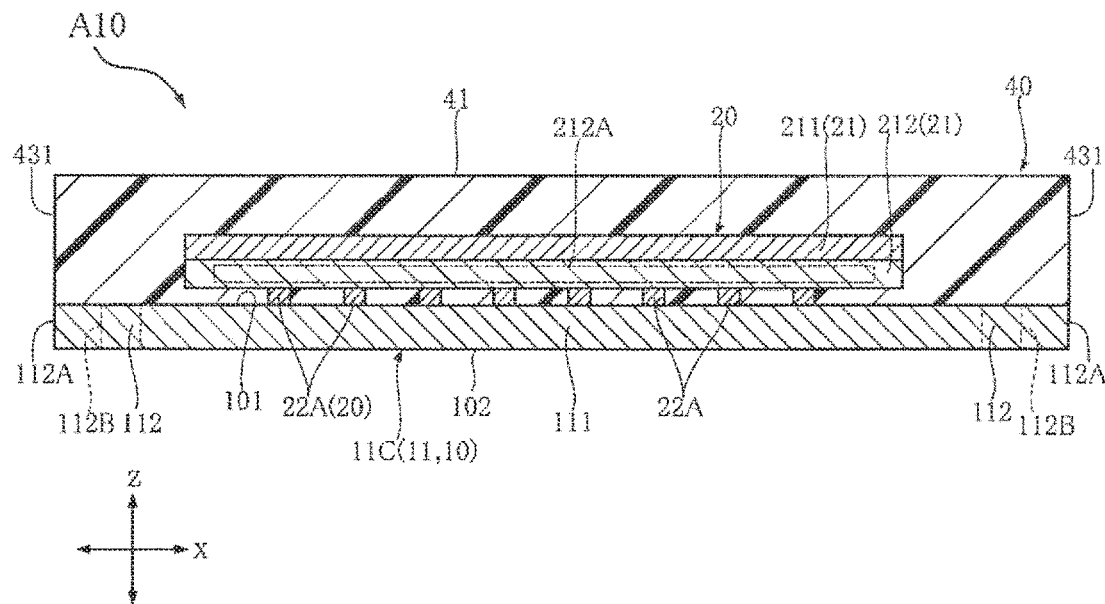
FIG. 12 is a cross-sectional view taken along line XII-XII of FIG. 3.

The projection portions 113 protrude from the other side in the second direction y of the main portion 111. A space between two adjoining projection portions 113 is filled with the sealing resin 40. Each of the projection portions 113 has a sub-end surface 113A as shown in FIG. 12. The sub-end surface 113A is continuous with both the principal surface 101 and the rear surface 102 of the second input terminal 11B, and is directed toward the other side in the second direction y. The sub-end surface 113A is exposed from the sealing resin 40. The sub-end surfaces 113A are arranged with predetermined intervals along the first direction x as shown in FIG. 7.

Figure 10:
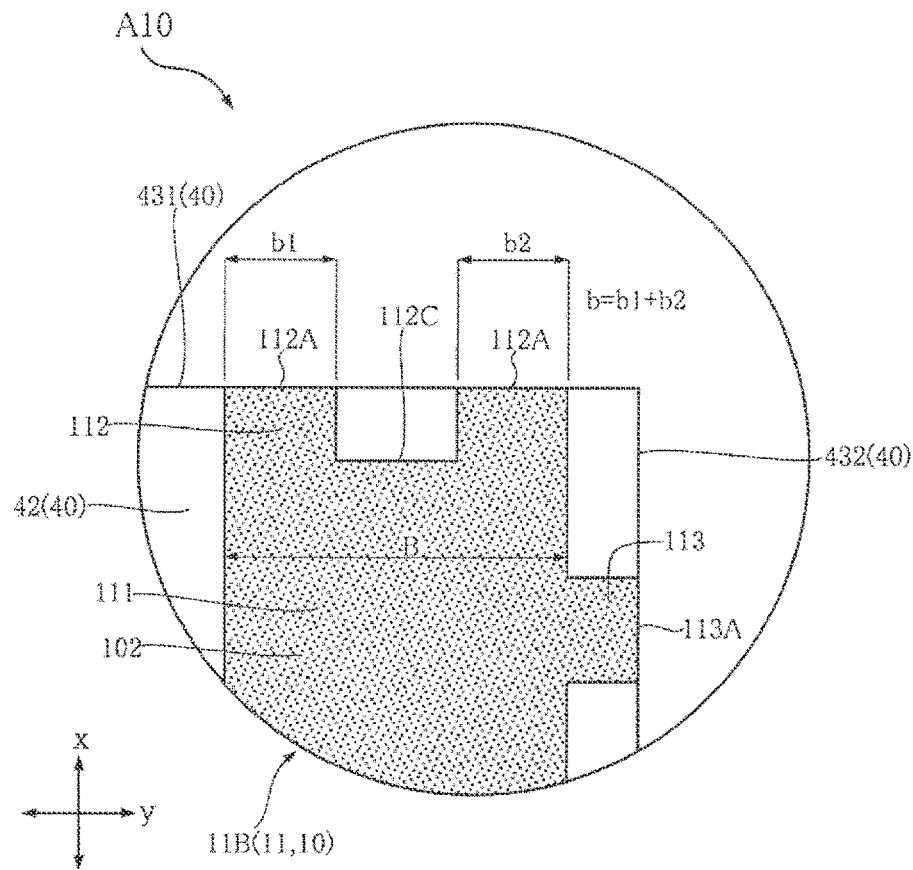
FIG. 10 is a partially enlarged view of FIG. 3.

A cutout portion 112C is formed at each of the pair of side portions 112 of the second input terminal 11B as shown in FIG. 10. The cutout portion 112C reaches the rear surface 102 from the principal surface 101 of the second input terminal 11B, and is concaved from the first end surface 112A in the first direction x. Hence, the first end surface 112A is divided into two regions that are separated from each other in the second direction y. Likewise, in the second input terminal 11B, the size b in the second direction y of each of the pair of first end surfaces 112A becomes smaller than the size B in the second direction y of the rear surface 102 of the main portion 111 because of the cutout portion 112C. The size b mentioned here is a sum obtained by adding the size b1 in the second direction y of one region of the first end surface 112A and the size b2 in the second direction y of the other region of the first end surface 112A together (b=b1+b2). The cutout portion 112C is filled with the sealing resin 40.

The area of the principal surface 101 is larger than the area of the rear surface 102 in each of the first leads 11 as shown in FIG. 3 and FIG. 4. In an example shown by the semiconductor package A10, the area of the rear surface 102 of the first input terminal 11A and the area of the rear surface 102 of the output terminal 11C are equal to each other. The area of the rear surface 102 of the second input terminal 11B is larger than the area of the rear surface 102 of the first input terminal 11A and larger than the area of the rear surface 102 of the output terminal 11C.

The principal surface 101 of the main portion 111 by which the semiconductor device 20 is supported may be subjected to, for example, silver plating (Ag plating) in each of the first input terminal 11A, the second input terminal 11B, and the output terminal 11C. Additionally, the rear surface 102 exposed from the sealing resin 40, the pair of first end surfaces 112A exposed from the sealing resin 40, and the plurality of sub-end surfaces 113A exposed from the sealing resin 40 may be subjected to, for example, tin plating (Sn plating) in each of the first input terminal 11A, the second input terminal 11B, and the output terminal 11C. Metal plating that consists of a plurality of metals, such as nickel (Ni), palladium (Pd), and gold (Au), which are laminated in this order, may be employed instead of tin plating.

Figure 8:
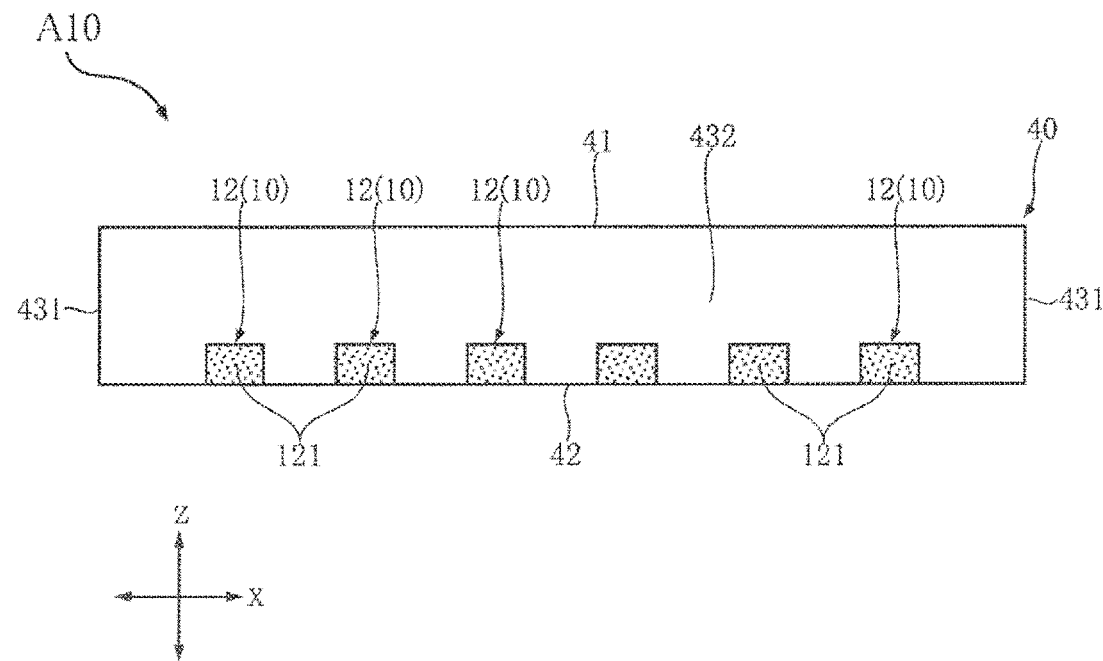
FIG. 8 is a left side view of the semiconductor package shown in FIG. 1.
Figure 11:
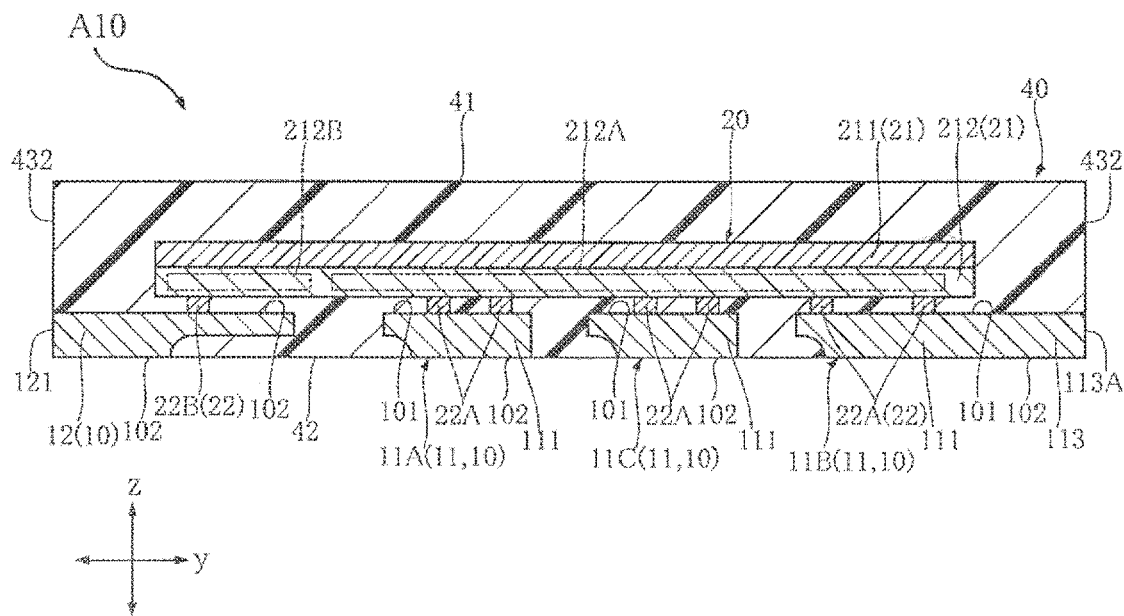
FIG. 11 is a cross-sectional view taken along line XI-XI of FIG. 3.

The plurality of second leads 12 are positioned closer to the one side in the second direction y than the plurality of first leads 11 as shown in FIG. 3. Any one of the second leads 12 is an earth terminal of the control circuit 212B that is a constituent of the semiconductor device 20. Electric power (voltage) to drive the control circuit 212B or an electric signal to be transmitted to the control circuit 212B is input into each of the other second leads 12. Each of the second leads 12 has a second end surface 121 as shown in FIG. 3, FIG. 4, and FIG. 11. The second end surface 121 is continuous with both the principal surface 101 and the rear surface 102 of the second lead 12, and is directed toward the one side in the second direction y. The second end surface 121 is exposed from the sealing resin 40. The second end surfaces 121 are arranged with predetermined intervals along the first direction x as shown in FIG. 8.

The area of the principal surface 101 is larger than the area of the rear surface 102 in each of the second leads 12 as shown in FIG. 3 and FIG. 4. The areas of the rear surfaces 102 of the second leads 12 are equal to each other. The rear surface 102 of each of the second leads 12 by which the semiconductor device 20 is supported may be subjected to, for example, silver plating. Additionally, the rear surface 102 and the second end surface 121 of each of the second leads 12 exposed from the sealing resin 40 may be subjected to, for example, tin plating. Metal plating that consists of a plurality of metals, such as nickel, palladium, and gold, which are laminated in this order, may be employed instead of tin plating.

The pair of third leads 13 are positioned between the first lead 11 (the first input terminal 11A) and the plurality of second leads 12 in the second direction y as shown in FIG. 3. The pair of third leads 13 are separated from each other in the first direction x. An electric signal, etc., to be transmitted to the control circuit 212B that is a constituent of the semiconductor device 20 are input into each of the pair of third leads 13.

Figure 14:
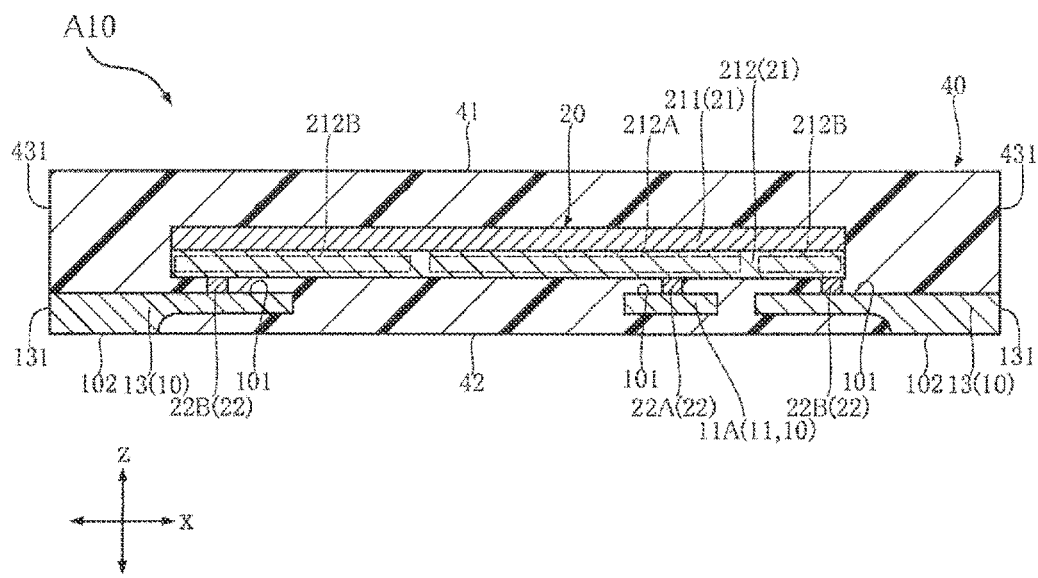
FIG. 14 is a cross-sectional view taken along line XIV-XIV of FIG. 3.

Each of the pair of third leads 13 has a third end surface 131 as shown in FIG. 3, FIG. 4, and FIG. 14. The third end surface 131 is continuous with both the principal surface 101 and the rear surface 102, and is directed in the first direction x. The third end surface 131 is exposed from the sealing resin 40. The third end surfaces 131 are arranged along the second direction y together with the first end surfaces 112A of the plurality of first leads 11.

The area of the principal surface 101 is larger than the area of the rear surface 102 in each of the pair of third leads 13 as shown in FIG. 3 and FIG. 4. The principal surface 101 of each of the pair of third leads 13 by which the semiconductor device 20 is supported may be subjected to, for example, silver plating. Additionally, the rear surface 102 and the third end surface 131 of each of the pair of third leads 13 exposed from the sealing resin 40 may be subjected to, for example, tin plating. Metal plating that consists of a plurality of metals, such as nickel, palladium, and gold, which are laminated in this order, may be employed instead of tin plating.

The semiconductor device 20 is electrically bonded to the conductive member 10 (i.e., to the plurality of first leads 11, to the plurality of second leads 12, and to the pair of third leads 13) by means of flip chip bonding, and is supported by these constituents as shown in FIG. 11 to FIG. 14. The semiconductor device 20 is covered with the sealing resin 40. The semiconductor device 20 has a main element body 21, a plurality of electrodes 22, and a surface protection film 23 that is an example of a second insulating layer of the present invention as shown in FIG. 12 to FIG. 18.

The main element body 21 serves as a main portion of the semiconductor device 20. The main element body 21 has a semiconductor substrate 211 and a semiconductor layer 212 as shown in FIG. 15 and FIG. 16.

Figure 15:
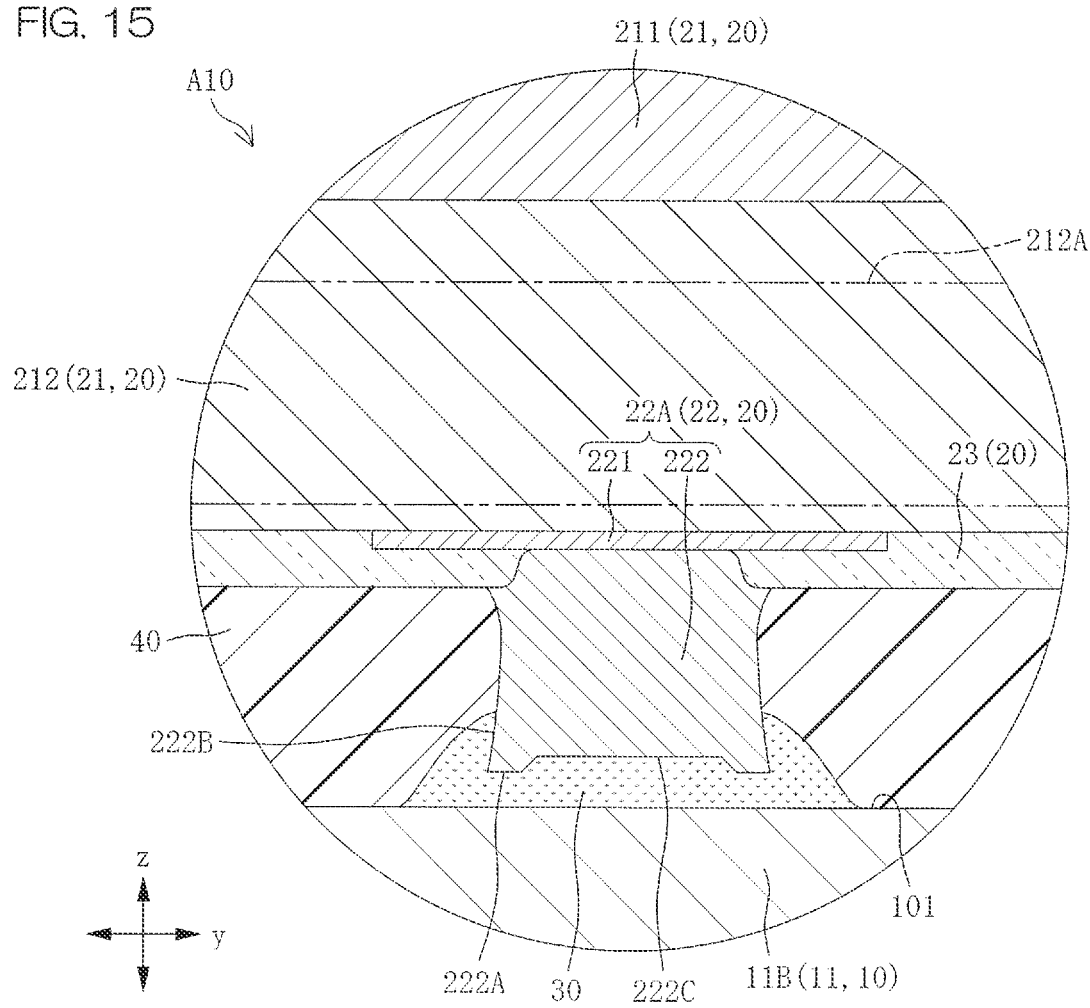
FIG. 15 is a partially enlarged view (near a first electrode) of FIG. 11.
Figure 16:
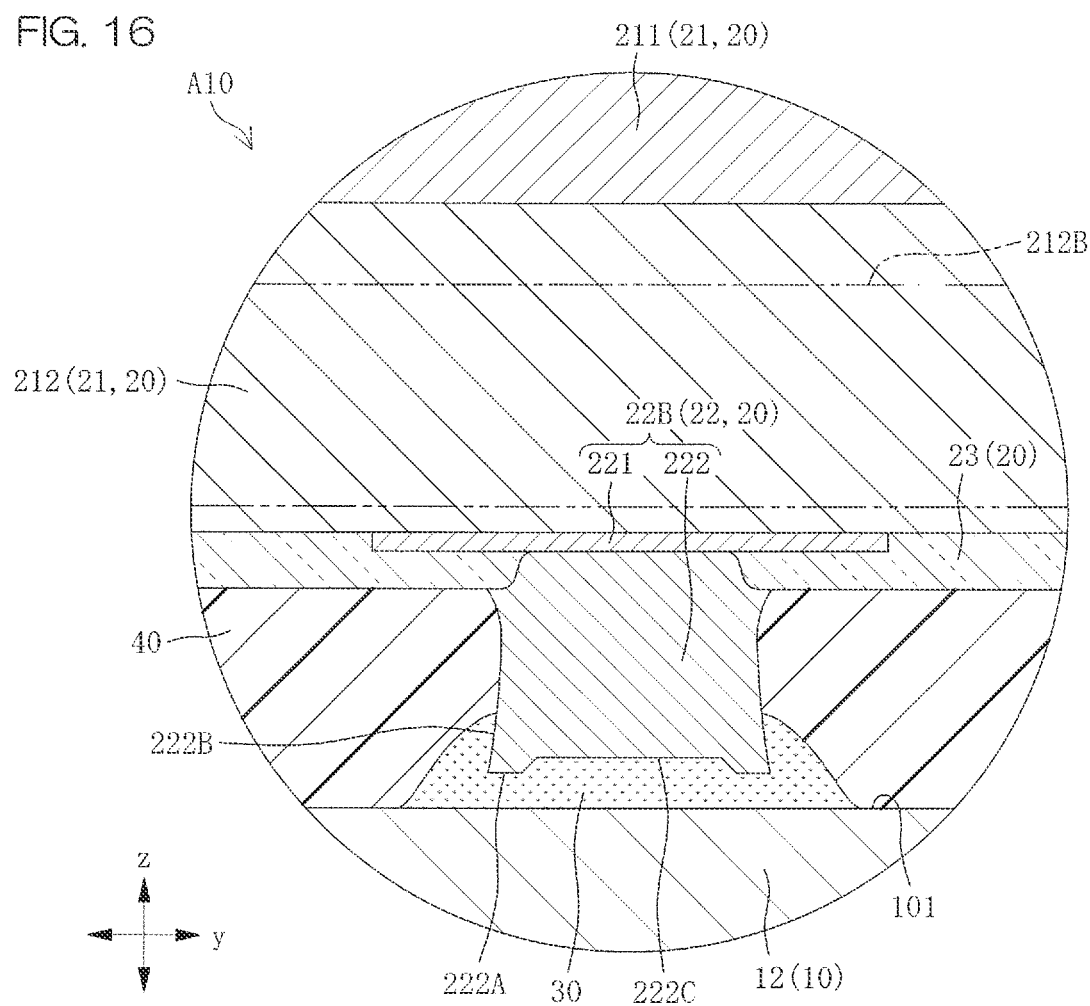
FIG. 16 is a partially enlarged view (near a second electrode) of FIG. 11.

The semiconductor substrate 211 supports the semiconductor layer 212, the plurality of electrodes 22, and the surface protection film 23 below the semiconductor substrate 211 as shown in FIG. 15 and FIG. 16. A material of which the semiconductor substrate 211 is made is, for example, Si (silicon) or silicon carbide (SiC).

The semiconductor layer 212 is laminated on the semiconductor substrate 211 on the side on which the semiconductor substrate 211 faces the principal surface 101 of the conductive member 10 as shown in FIG. 11 to FIG. 14. The semiconductor layer 212 includes a plurality of types of p type semiconductors and n type semiconductors based on a difference in amount between chemical elements to be doped. The switching circuit 212A and the control circuit 212B that conducts electricity to the switching circuit 212A are formed at the semiconductor layer 212. The switching circuit 212A is MOSFET (Metal-Oxide-Semiconductor Field-Effect Transistor), IGBT (Insulated Gate Bipolar Transistor), etc.

In an example shown by the semiconductor package A10, the switching circuit 212A is partitioned into two regions, i.e., is partitioned into a high voltage region (upper arm circuit) and a low voltage region (lower arm circuit). Each of the regions is formed of a single n-channel type MOSFET. The control circuit 212B is formed by a gate driver that drives the switching circuit 212A, a bootstrap circuit that corresponds to a high voltage region of the switching circuit 212A, etc., and performs control so that the switching circuit 212A is normally driven. A wiring layer (described later) is formed at the semiconductor layer 212. The wiring layer enables the switching circuit 212A and the control circuit 212B to conduct electricity to each other.

The electrodes 22 protrude from the main element body 21 on the side on which the main element body 21 faces the principal surface 101 of the conductive member 10 toward the principal surface 101 of the conductive member 10 as shown in FIG. 11 to FIG. 14. The electrodes 22 are electrically bonded to the principal surface 101 of the conductive member 10. The electrodes 22 include a plurality of first electrodes 22A and a plurality of second electrodes 22B. The first electrodes 22A conducts electricity to the switching circuit 212A of the semiconductor layer 212. The first electrodes 22A are also electrically bonded to the principal surface 101 of the first leads 11. Hence, the first leads 11 conduct electricity to the switching circuit 212A. Additionally, the second electrodes 22B conduct electricity to the control circuit 212B of the semiconductor layer 212. Most of the second electrodes 22B are also electrically bonded to the principal surface 101 of the second leads 12. The remaining second electrodes 22B are electrically bonded to the principal surface 101 of the pair of third leads 13. Hence, the second leads 12 and the pair of third leads 13 conduct electricity to the control circuit 212B.

Each of the electrodes 22 has a base portion 221 and a pillar portion 222 as shown in FIG. 15 and FIG. 16. The base portion 221 conducts electricity to either the switching circuit 212A or the control circuit 212B of the semiconductor layer 212. The pillar portion 222 protrudes from the base portion 221 toward the principal surface 101 of the conductive member 10. The pillar portion 222 has a forward end surface 222A and a side surface 222B. The forward end surface 222A faces the principal surface 101 of the conductive member 10. The side surface 222B is continuous with the forward end surface 222A, and is directed in a direction perpendicular to the thickness direction Z. In the semiconductor package A10, a concave portion 222C that is concaved from the forward end surface 222A toward the main element body 21 is formed at the pillar portion 222.

The surface protection film 23 covers the main element body 21 on the side on which the main element body 21 faces the principal surface 101 of the conductive member 10 as shown in FIG. 15 and FIG. 16. In each of the electrodes 22, the forward end surface 222A of the pillar portion 222 is positioned between the principal surface 101 of the conductive member 10 and the surface protection film 23 in the thickness direction Z. In the semiconductor package A10, the surface protection film 23 is contiguous to both the base portion 221 and the pillar portion 222 of the electrodes 22.

The bonding layer 30 is contiguous to both the principal surface 101 of the conductive member 10 and the electrodes 22 as shown in FIG. 15 and FIG. 16. The bonding layer 30 has a conductive property. Hence, the electrodes 22 are electrically bonded to the principal surface 101 of the conductive member 10. In each of the electrodes 22, the bonding layer 30 is contiguous to both the forward end surface 222A and the side surface 222B of the pillar portion 222. In the semiconductor package A10, the bonding layer 30 is also contiguous to the concave portion 222C of the pillar portion 222. Additionally, the pillar portion 222 of the semiconductor device 20 is buried in the bonding layer 30. Hence, in the pillar portion 222, not only the forward end surface 222A and the concave portion 222C but also a part of the side surface is covered with the bonding layer 30.

The sealing resin 40 has a top surface 41, a bottom surface 42, a pair of first side surfaces 431, and a pair of second side surfaces 432 as shown in FIG. 5 to FIG. 8. A material of which the sealing resin 40 is made is, for example, black epoxy resin.

The top surface 41 faces the same side as the principal surface 101 of the conductive member 10 in the thickness direction Z as shown in FIG. 11 to FIG. 14. The bottom surface 42 faces the side opposite to the top surface 41 as shown in FIG. 5 to FIG. 8. The rear surface 102 of the first leads 11, the rear surface 102 of the second leads 12, and the rear surface 102 of the pair of third leads 13 are exposed from the bottom surface 42 as shown in FIG. 4.

Figure 13:
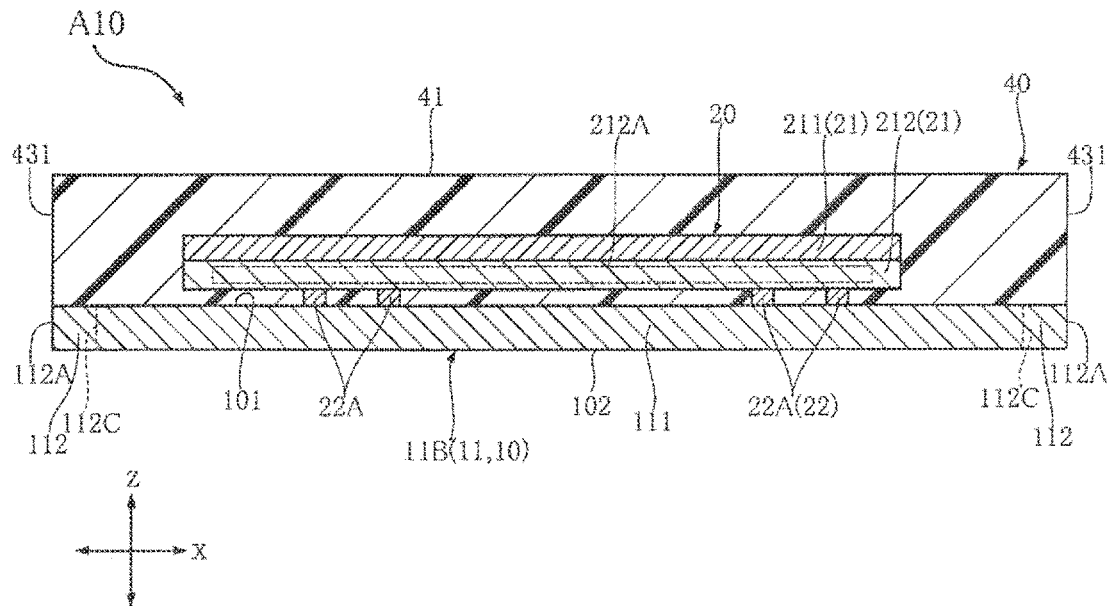
FIG. 13 is a cross-sectional view taken along line XIII-XIII of FIG. 3.

The pair of first side surfaces 431 are continuous with both the top surface 41 and the bottom surface 42, and are directed in the first direction x as shown in FIG. 7 and FIG. 8. The pair of first side surfaces 431 are apart from each other in the second direction y. The first end surface 112A of the first leads 11 and the third end surface 131 of the third lead 13 are exposed from each of the pair of first side surfaces 431 so as to become flush with the first side surface 431 as shown in FIG. 12 to FIG. 14.

Figure 5:
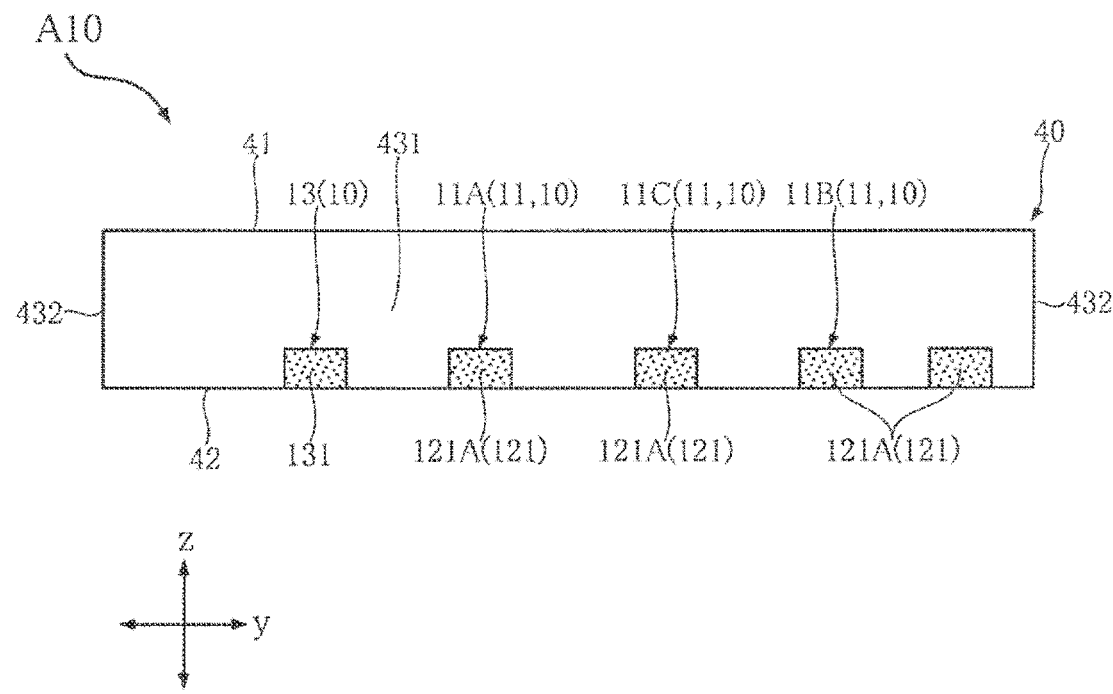
FIG. 5 is a front view of the semiconductor package shown in FIG. 1.
Figure 6:
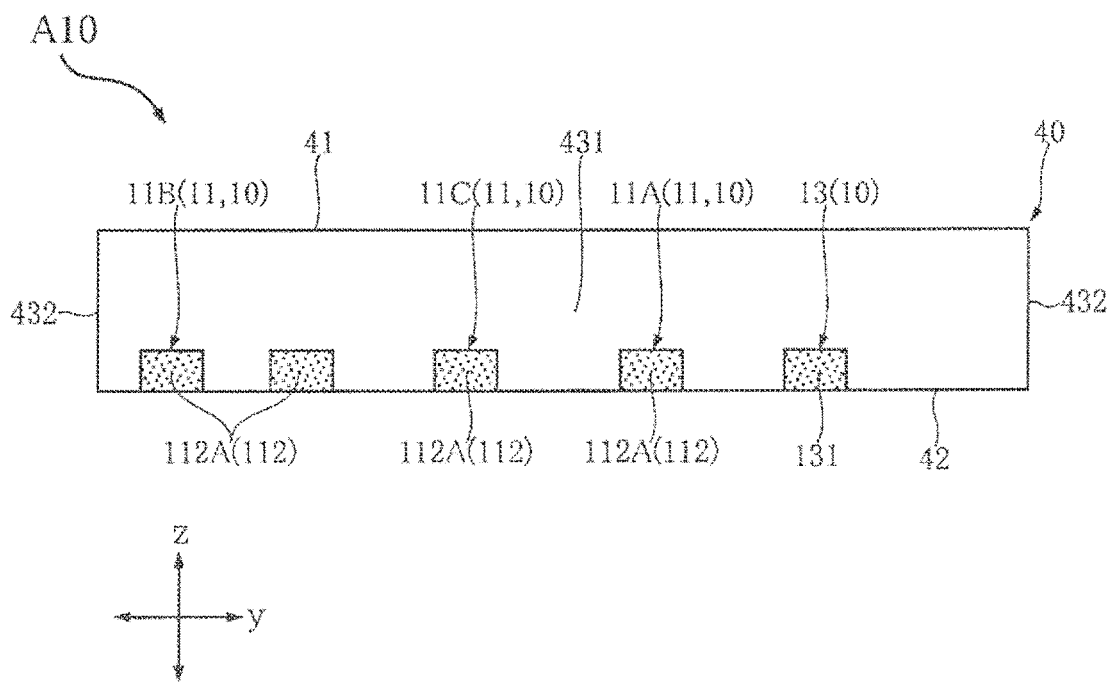
FIG. 6 is a rear view of the semiconductor package shown in FIG. 1.

The pair of second side surfaces 432 are continuous with all of the top surface 41, the bottom surface 42, and the pair of first side surfaces 431, and are directed in the second direction y as shown in FIG. 5 and FIG. 6. The pair of second side surfaces 432 are apart from each other in the first direction x. The second end surfaces 121 of the second leads 12 is exposed from the second side surface 432 positioned on the one side in the second direction y so as to become flush with the second side surface 432 as shown in FIG. 11. The sub-end surfaces 113A of the second input terminal 11B (first lead 11) are exposed from the second side surface 432 positioned on the other side in the second direction y so as to become flush with the second side surface 432.

The semiconductor package A10 is made of the conductive member 10 having the principal surface 101, the semiconductor device 20 having the main element body 21 and the plurality of electrodes 22 electrically bonded to the principal surface 101, and the bonding layer 30 contiguous to both the principal surface 101 and the plurality of electrodes 22. Each of the electrodes 22 has the base portion 221 contiguous to the main element body 21 on the side on which the main element body 21 faces the principal surface 101, and the pillar portion 222 that protrudes from the base portion 221 toward the principal surface 101 and that is contiguous to the bonding layer 30. Hence, the semiconductor device 20 is electrically bonded to the conductive member 10 by means of flip chip bonding.

Figure 17:
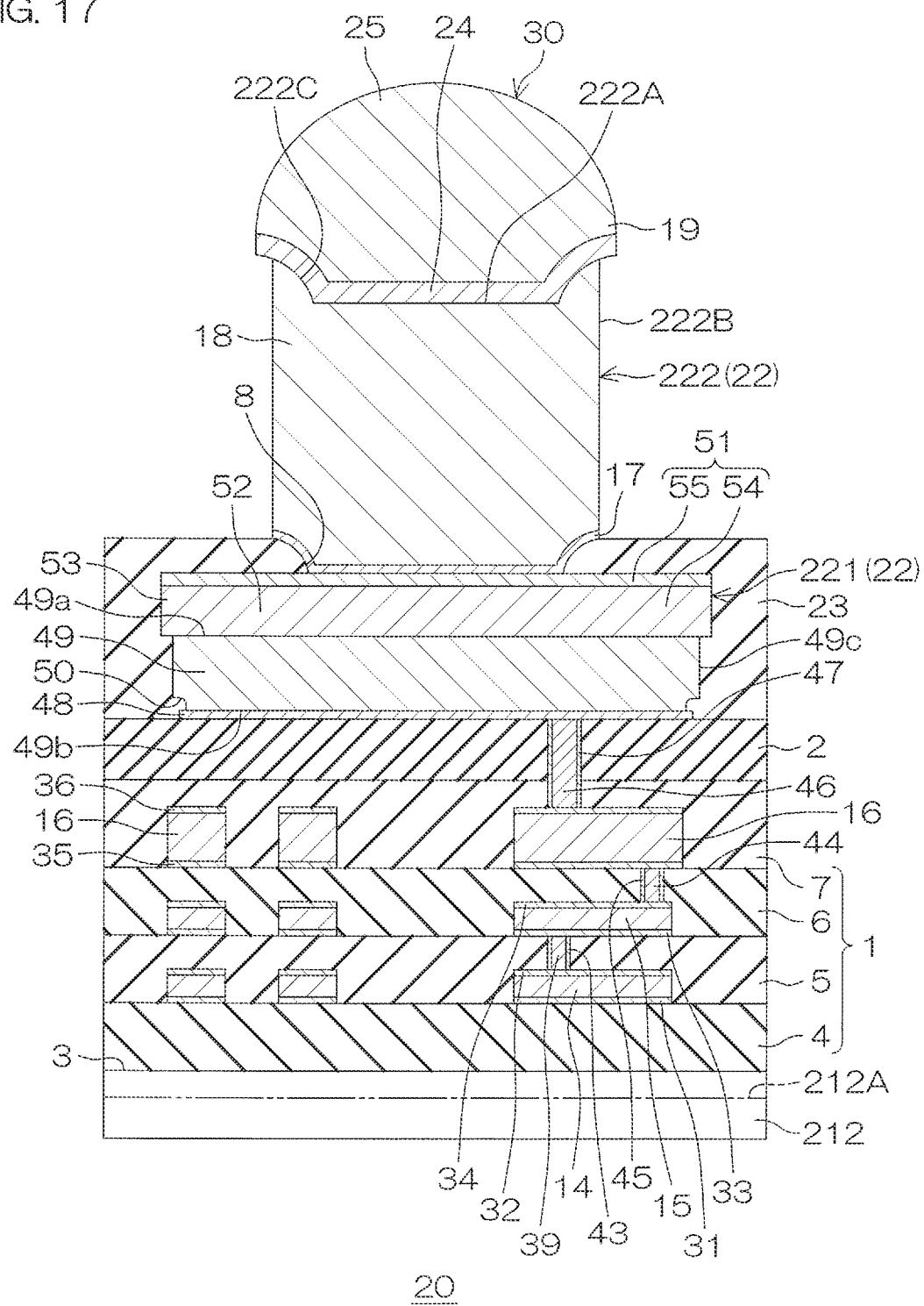
FIG. 17 is a view to describe a wiring structure of a semiconductor device.

FIG. 17 is a view to describe a wiring structure of the semiconductor device 20. In FIG. 17, the semiconductor device 20, which has not yet been bonded to the conductive member 10 by means of flip chip bonding, is shown. Additionally, in FIG. 17, the semiconductor device 20 is shown in a state in which the pillar portion 222 protrudes upwardly. Therefore, there is an upside-down relationship between FIGS. 11 to 16 and FIG. 17.

The semiconductor device 20 includes a multilayer wiring structure 1, a passivation film 2 that is an example of an insulating layer of the present invention, the base portion 221 of the electrode 22, the surface protection film 23, the pillar portion 222 of the electrode 22, and the bonding layer 30. In FIG. 17, only one electrode 22 among the electrodes 22 is shown.

The multilayer wiring structure 1 includes a plurality of interlayer insulating films 4 to 7 formed on a device-forming surface 3 (first surface) of the semiconductor layer 212 and a plurality of electrode layers 14 to 16 formed in the plurality of interlayer insulating films 4 to 7. The electrode layers 14 to 16 are to form the multilayer wiring structure 1, and hence may be referred to as wiring layers 14 to 16, respectively.

The plurality of interlayer insulating films 4 to 7 include a first interlayer insulating film 4 formed on the device-forming surface 3 of the semiconductor layer 212, a second interlayer insulating film 5 formed on the first interlayer insulating film 4, a third interlayer insulating film 6 formed on the second interlayer insulating film 5, and a fourth interlayer insulating film 7 formed on the third interlayer insulating film 6. The first interlayer insulating film 4, the second interlayer insulating film 5, the third interlayer insulating film 6, and the fourth interlayer insulating film 7 may each include an oxide film ($SiO_2$ film) or a nitride film (SiN film).

The plurality of electrode layers 14 to 16 are electrically connected to the switching circuit 212A and the control circuit 212B that are formed at the semiconductor layer 212 (only the switching circuit 212A is shown in FIG. 17).

The plurality of electrode layers 14 to 16 include a first electrode layer 14 that is formed on the first interlayer insulating film 4 and that is covered with the second interlayer insulating film 5, a second electrode layer 15 that is formed on the second interlayer insulating film 5 and that is covered with the third interlayer insulating film 6, and a third electrode layer 16 that is formed on the third interlayer insulating film 6 and that is covered with the fourth interlayer insulating film 7. The first electrode layer 14, the second electrode layer 15, and the third electrode layer 16 may each include copper or aluminum.

A first barrier layer 31 is formed at a lower surface of the first electrode layer 14. The first barrier layer 31 prevents an electrode material of which the first electrode layer 14 is made from diffusing in the first interlayer insulating film 4.

A first barrier layer 32 is formed at an upper surface of the first electrode layer 14. The first barrier layer 32 prevents an electrode material of which the first electrode layer 14 is made from diffusing in the second interlayer insulating film 5.

A second barrier layer 33 is formed at a lower surface of the second electrode layer 15. The second barrier layer 33 prevents an electrode material of which the second electrode layer 15 is made from diffusing in the second interlayer insulating film 5.

A second barrier layer 34 is formed at an upper surface of the second electrode layer 15. The second barrier layer 34 prevents an electrode material of which the second electrode layer 15 is made from diffusing in the third interlayer insulating film 6.

A third barrier layer 35 is formed at a lower surface of the third electrode layer 16. The third barrier layer 35 prevents an electrode material of which the third electrode layer 16 is made from diffusing in the third interlayer insulating film 6.

A third barrier layer 36 is formed at an upper surface of the third electrode layer 16. The third barrier layer 36 prevents an electrode material of which the third electrode layer 16 is made from diffusing in the fourth interlayer insulating film 7.

Each of the barrier layers 31 to 36 may have a single-layer structure consisting of a titanium nitride layer or a titanium layer, or may have a laminated structure including a titanium nitride layer and a titanium layer formed on the titanium nitride layer. Each of the barrier layers 31 to 36 may be a layer made of a mutually identical material, or may be a layer made of a mutually different material.

The passivation film 2 is formed on the multilayer wiring structure 1 so as to cover the multilayer wiring structure 1. More specifically, the passivation film 2 covers the fourth interlayer insulating film 7.

The passivation film 2 may include an oxide film ($SiO_2$ film), a BPSG (Boron Phosphorus Silicon Glass) film, or a nitride film (SiN film). In the present preferred embodiment, the passivation film 2 is made of a nitride film (SiN film).

A first via 39 that passes through the second interlayer insulating film 5 is formed in the second interlayer insulating film 5 between the upper surface of the first electrode layer 14 and the lower surface of the second electrode layer 15. The first electrode layer 14 is electrically connected to the second electrode layer 15 through the first via 39.

A first via barrier film 43 is formed between the first via 39 and the second interlayer insulating film 5. The first via 39 may include tungsten. The first via barrier film 43 may include titanium nitride.

A second via 44 that passes through the third interlayer insulating film 6 is formed in the third interlayer insulating film 6 between the upper surface of the second electrode layer 15 and the lower surface of the third electrode layer 16. The second electrode layer 15 is electrically connected to the third electrode layer 16 through the second via 44.

A second via barrier film 45 is formed between the second via 44 and the third interlayer insulating film 6. The second via 44 may include tungsten. The second via barrier film 45 may include titanium nitride.

A third via 46 that passes through the passivation film 2 and through the fourth interlayer insulating film 7 is formed in the passivation film 2 and the fourth interlayer insulating film 7 on the third electrode layer 16. The third via 46 is exposed from the passivation film 2, and is electrically connected to the third electrode layer 16.

An exposed surface of the third via 46 is formed so as to be flush with the surface of the passivation film 2. A third via barrier film 47 is formed between the third via 46 and the fourth interlayer insulating film 7 and between the third via 46 and the passivation film 2. The third via 46 may include tungsten. The third via barrier film 47 may include titanium nitride.

The base portion 221 of the electrode 22 is formed on the passivation film 2 so as to cover the third via 46. The base portion 221 of the electrode 22 has a laminated structure including a barrier electrode layer 48 formed on the passivation film 2 and a Cu electrode layer 49 that includes a metal mainly containing copper and that is an example of a Cu conductive layer of the present invention formed on a principal surface of the barrier electrode layer 48. The barrier electrode layer 48 prevents an electrode material of which the Cu electrode layer 49 is made from diffusing in the passivation film 2.

Herein, the "metal mainly containing copper" denotes a metal in which the mass ratio (mass %) of copper that is a constituent of the Cu electrode layer 49 is the highest with respect to the other constituent elements of the Cu electrode layer 49 (the same applies hereinafter). If the Cu electrode layer 49 is made of an aluminum-copper alloy (Al—Cu alloy), the mass ratio $R_{Cu}$ of copper is higher than the mass ratio $R_{Al}$ of aluminum ($R_{Cu}$>$R_{Al}$).

If the Cu electrode layer 49 is made of an aluminum-silicon-copper alloy (Al—Si—Cu alloy), the mass ratio $R_{Cu}$ of copper is higher than the mass ratio $R_{Al}$ of aluminum and higher than the mass ratio $R_{Si}$ of silicon ($R_{Cu}$>$R_{Al}$, and $R_{Cu}$>$R_{Si}$).

The "metal mainly containing copper" includes high purity copper whose purity is 99.9999% (6N) or more or high purity copper whose purity is 99.99% (4N) or more, etc., although there is a case in which it has a slight amount of impurities.

The barrier electrode layer 48 is formed on the passivation film 2 so as to cover the third via 46. The barrier electrode layer 48 is electrically connected through the third via 46 to the first electrode layer 14, to the second electrode layer 15, and to the third electrode layer 16.

The barrier electrode layer 48 may have a thickness of 100 nm to 500 nm (in the present preferred embodiment, approximately 100 nm). The barrier electrode layer 48 may have a single-layer structure consisting of a single metal layer. The barrier electrode layer 48 may have a laminated structure consisting of a plurality of metal layers laminated.

Preferably, the barrier electrode layer 48 has a thermal expansion coefficient smaller than that of the Cu electrode layer 49. Additionally, preferably, the barrier electrode layer 48 has a rigidity modulus larger than that of the Cu electrode layer 49.

The barrier electrode layer 48 may include at least one kind of titanium, titanium nitride, tantalum, tungsten, molybdenum, chromium, and ruthenium. These metallic materials make it possible to realize the barrier electrode layer 48 having a thermal expansion coefficient (4 μm/m·K to 9 μm/m·K) smaller than that of the Cu electrode layer 49. If the Cu electrode layer 49 is made of high purity copper, the thermal expansion coefficient of the Cu electrode layer 49 is approximately 16.5 μm/m·K.

The barrier electrode layer 48 may include at least one kind of tantalum, tungsten, molybdenum, chromium, and ruthenium. These metallic materials make it possible to realize the barrier electrode layer 48 having a thermal expansion coefficient (4 μm/m·K to 7 μm/m·K) smaller than that of the Cu electrode layer 49.

Additionally, these metallic materials make it possible to realize the barrier electrode layer 48 having a rigidity modulus (50 GPa to 180 GPa) larger than that of the Cu electrode layer 49. If the Cu electrode layer 49 is made of high purity copper, the rigidity modulus of the Cu electrode layer 49 is approximately 48 GPa.

The Cu electrode layer 49 occupies the most of the base portion 221 of the electrode 22. The Cu electrode layer 49 may have a thickness of 2 μm to 6 μm. The Cu electrode layer 49 has an upper surface 49a (first surface), a lower surface 49b (second surface) positioned on the side opposite to the upper surface 49a, and a side surface 49c by which the upper surface 49a and the lower surface 49b are connected.

The lower surface 49b of the Cu electrode layer 49 is mechanically and electrically connected to the barrier electrode layer 48.

A circumferential edge of the lower surface 49b of the Cu electrode layer 49 is away from a circumferential edge of the barrier electrode layer 48 toward an inward side of the barrier electrode layer 48. The lower surface 49b of the Cu electrode layer 49 is formed so as to be narrower than the upper surface 49a of the Cu electrode layer 49 with respect to a direction along the surface of the passivation film 2.

More specifically, a concave portion 50 that is hollowed toward the inward side of the Cu electrode layer 49 and by which an upper surface of an edge portion of the barrier electrode layer 48 is exposed is formed in a region on the lower-surface-49b side of the side surface 49c in the Cu electrode layer 49.

The concave portion 50 is formed in a convex curved shape that swells toward an obliquely upper part of the Cu electrode layer 49. Hence, an inner surface of the concave portion 50 is a convex curved surface. Because of the concave portion 50, the lower surface 49b of the Cu electrode layer 49 is formed so as to be narrower than the upper surface 49a of the Cu electrode layer 49.

In the present preferred embodiment, the side surface 49c of the Cu electrode layer 49 is positioned further outward than the circumferential edge (side surface) of the barrier electrode layer 48. Therefore, in the present preferred embodiment, the circumferential edge (side surface) of the barrier electrode layer 48 is positioned in a region between the circumferential edge of the lower surface 49b of the Cu electrode layer 49 and the side surface 49c of the Cu electrode layer 49. The side surface 49c of the Cu electrode layer 49 may be positioned further inward than the circumferential edge (side surface) of the barrier electrode layer 48.

The base portion 221 of the electrode 22 includes a pad electrode layer 51 that is an example of an intermediate layer of the present invention formed at the upper surface 49a of the Cu electrode layer 49. The pad electrode layer 51 is formed on the upper surface 49a of the Cu electrode layer 49 so as to cover the upper surface 49a of the Cu electrode layer 49.

The pad electrode layer 51 includes a first portion 52 that is mechanically and electrically connected to the upper surface 49a of the Cu electrode layer 49 and a second portion 53 that projects from the first portion 52 toward a lateral part of the Cu electrode layer 49.

In the present preferred embodiment, the pad electrode layer 51 has a laminated structure that includes a first layer 54 formed on the upper surface 49a of the Cu electrode layer 49 and a second layer 55 formed on the first layer 54.

The first layer 54 and the second layer 55 are each made of a material that has a linear expansion coefficient smaller than that of the Cu electrode layer 49 and smaller than that of a Cu pillar 18 (described later). For example, the linear expansion coefficient of the Cu electrode layer 49 and the linear expansion coefficient of the Cu pillar 18 may be 16.0 to 18.0 ($10^{-6}$/° C.), and the linear expansion coefficient of the first layer 54 and the linear expansion coefficient of the second layer 55 may be 10.0 to 15.0 ($10^{-6}$/° C.).

For example, Ni=approximately 13.3 ($10^{-6}$/° C.), Pd=approximately 11.8 ($10^{-6}$/° C.), Au=approximately 14.2 ($10^{-6}$/° C.), W=approximately 4.3 ($10^{-6}$/° C.), Pt=approximately 8.9 ($10^{-6}$/° C.), etc., are mentioned as the material used for the first layer 54 and for the second layer 55. Among these elements, the first layer 54 is made of a nickel (Ni) layer, and the second layer 55 is made of a palladium (Pd) layer in the present preferred embodiment.

The second layer 55 is formed with a thickness smaller than the thickness of the first layer 54. The second layer 55 may be made of a metal in which the mass ratio (mass %) of palladium that is a constituent element of the second layer 55 is the highest with respect to the other constituent elements of the second layer 55. In other words, the second layer 55 is merely required to be made of a metal mainly containing palladium. Additionally, the first layer 54 may be made of a metal in which the mass ratio (mass %) of nickel that is a constituent element of the first layer 54 is the highest with respect to the other constituent elements of the first layer 54. In other words, the first layer 54 is merely required to be made of a metal mainly containing nickel.

The thickness of the first layer 54 may be 0.5 μm to 5 μm. The thickness of the second layer 55 may be 0.05 μm to 0.5 μm.

The surface protection film 23 is formed on the passivation film 2. The surface protection film 23 covers the base portion 221 of the electrode 22. An opening 8 by which a part of the base portion 221 of the electrode 22 is exposed is formed in the surface protection film 23. The surface protection film 23 has electric insulating properties, and is made of, for example, polyimide.

The pillar portion 222 of the electrode 22 is contiguous to the base portion 221 in the opening 8 of the surface protection film 23, and protrudes from the opening 8 toward the side opposite to the base portion 221. The pillar portion 222 of the electrode 22 has a laminated structure that includes a barrier layer 17 formed on the surface protection film 23 and the Cu pillar 18 that includes a metal mainly containing copper and that is formed on a principal surface of the barrier layer 17. The barrier layer 17 prevents a material of which the Cu pillar 18 is made from diffusing in the surface protection film 23. Herein, the "metal mainly containing copper" of which the Cu pillar 18 is made is defined in the same way as in the Cu electrode layer 49 mentioned above.

The barrier layer 17 is formed on the surface protection film 23 so as to cover the base portion 221 in the opening 8 of the surface protection film 23 (so as to become contiguous to the second layer 55). The barrier layer 17 is electrically connected to the base portion 221.

The barrier layer 17 may have a thickness of 100 nm to 500 nm (in the present preferred embodiment, approximately 100 nm). The barrier layer 17 may have a single-layer structure consisting of a single metal layer. The barrier layer 17 may have a laminated structure consisting of a plurality of metal layers laminated.

The Cu pillar 18 may have a thickness of 20 μm to 60 μm. Additionally, in the pillar portion 222, a pillar made of materials other than Cu may be used instead of the Cu pillar 18.

The bonding layer 30 is formed on the forward end surface 222A of the pillar portion 222 of the electrode 22. The bonding layer 30 has a projecting portion 19 that partially projects more sidewardly than the side surface 222B of the pillar portion 222.

The bonding layer 30 may have a layer made of a material having a linear expansion coefficient smaller than that of the Cu pillar 18 at its part contiguous to the Cu pillar 18. In the present preferred embodiment, the bonding layer 30 has a laminated structure that includes a first layer 24 formed on the pillar portion 222 (Cu pillar 18) and a second layer 25 formed on the first layer 24. The first layer 24 is made of a material having a linear expansion coefficient smaller than that of the Cu pillar 18. More specifically, the first layer 24 may include a nickel layer, and the second layer 25 may include a solder layer.

A metal in which the mass ratio (mass %) of nickel is the highest with respect to the other constituent elements of the nickel layer is made may be used for the nickel layer. In other words, the first layer 24 is merely required to be a layer made of a metal mainly containing nickel.

It is preferable to use a lead-free solder, which has no lead or almost no lead, for the solder layer. Various materials, for example, such as SnAgCu-based material, SnZnBi-based material, SnCu-based material, SnAgInBi-based material, or SnZnAl-based material, can be used for the lead-free solder. Additionally, the second layer 25 may be formed in a substantially spherical shape as shown in FIG. 17 before flip chip bonding.

Figure 18A:
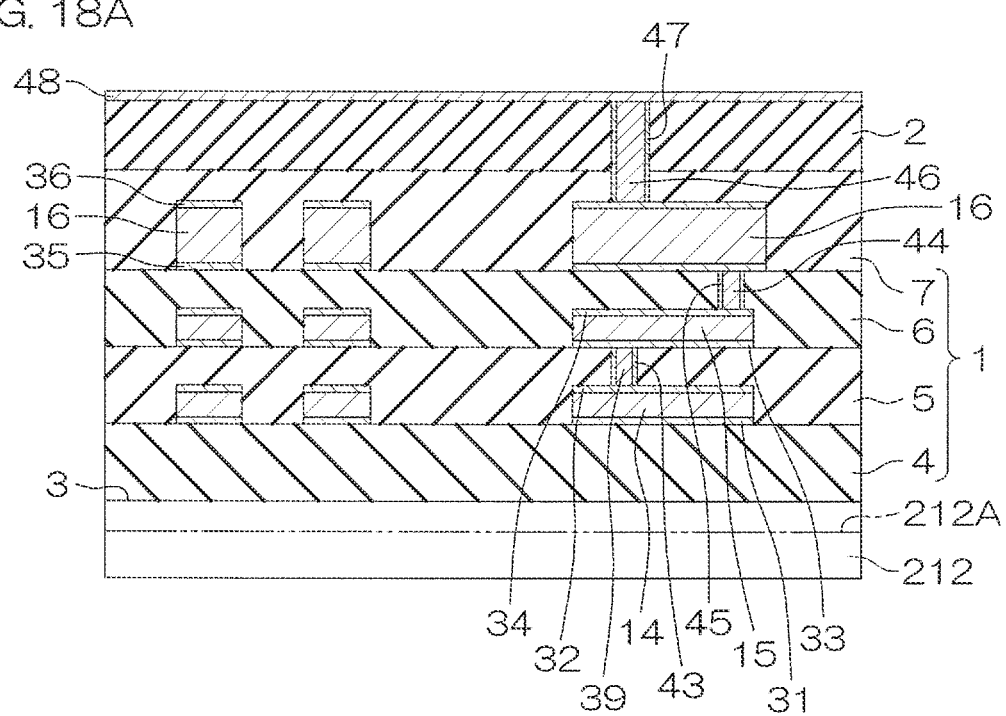
FIG. 18A to FIG. 18P are views to describe a part of a manufacturing process of the semiconductor package.
Figure 18E:
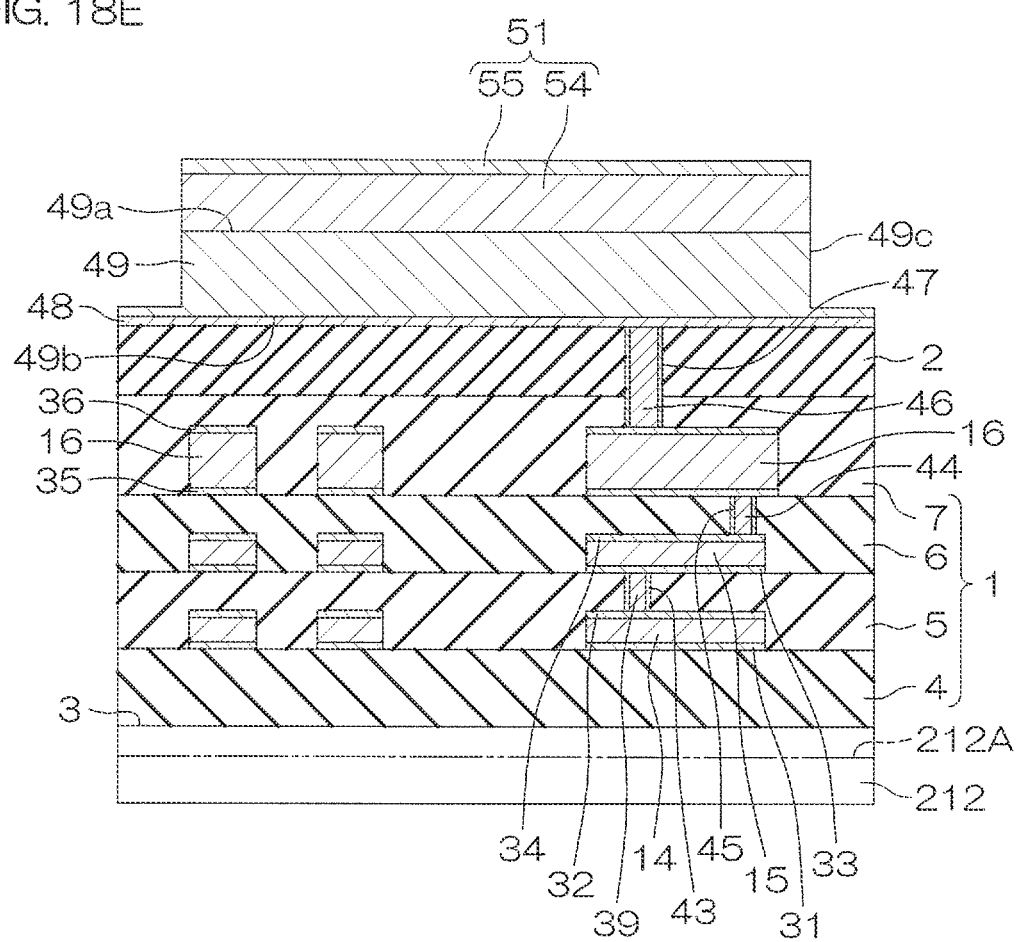
Figure 18G:
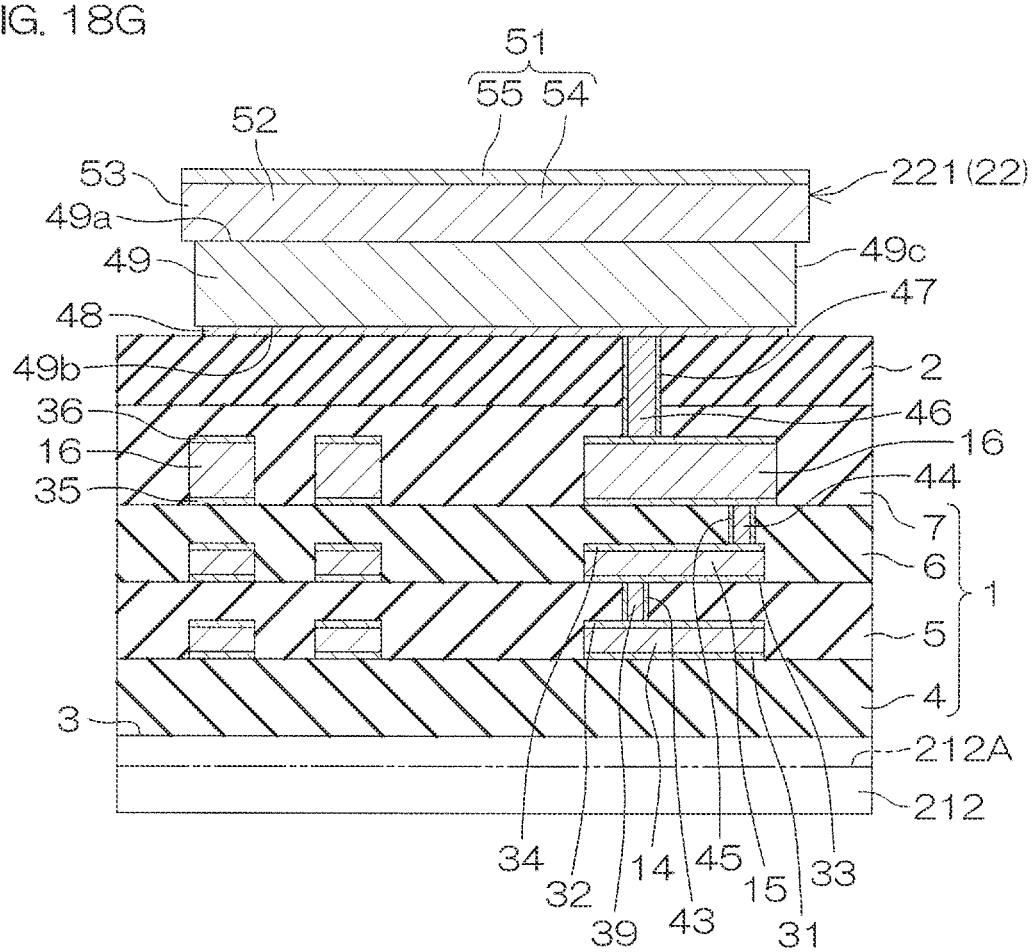
Figure 18H:
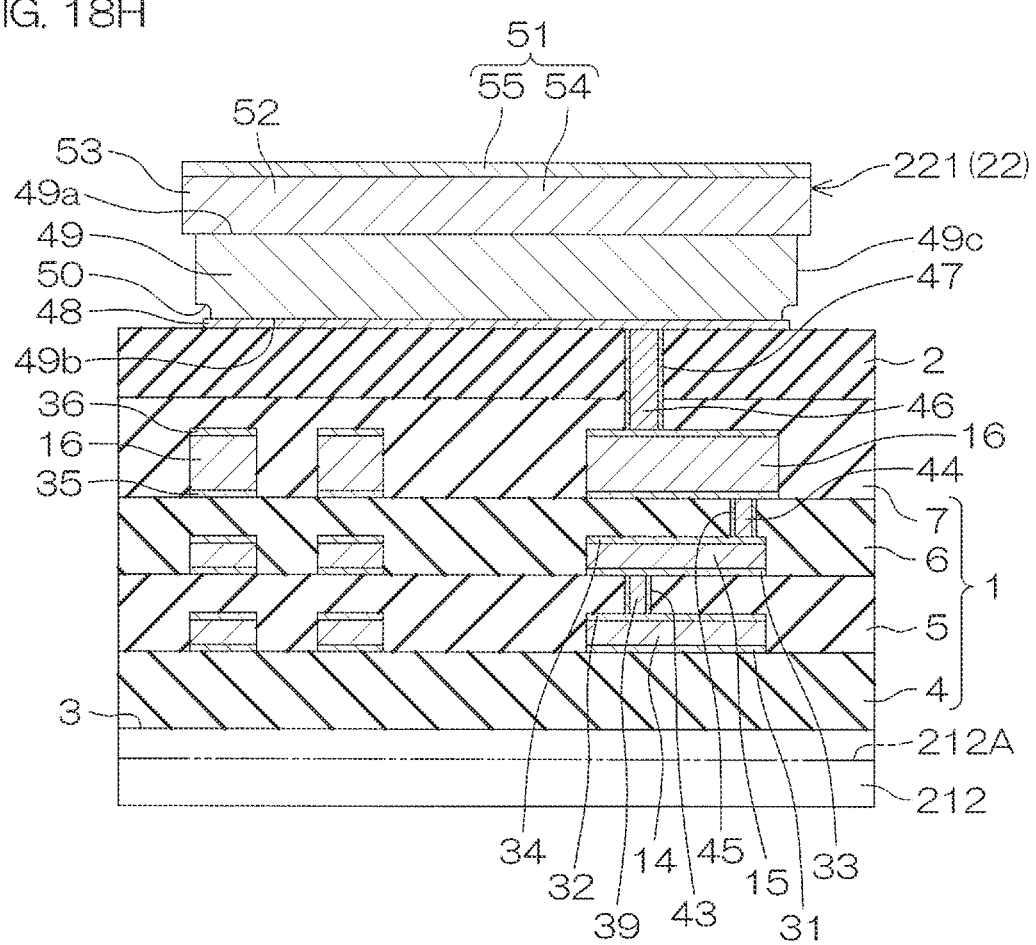
Figure 18K:
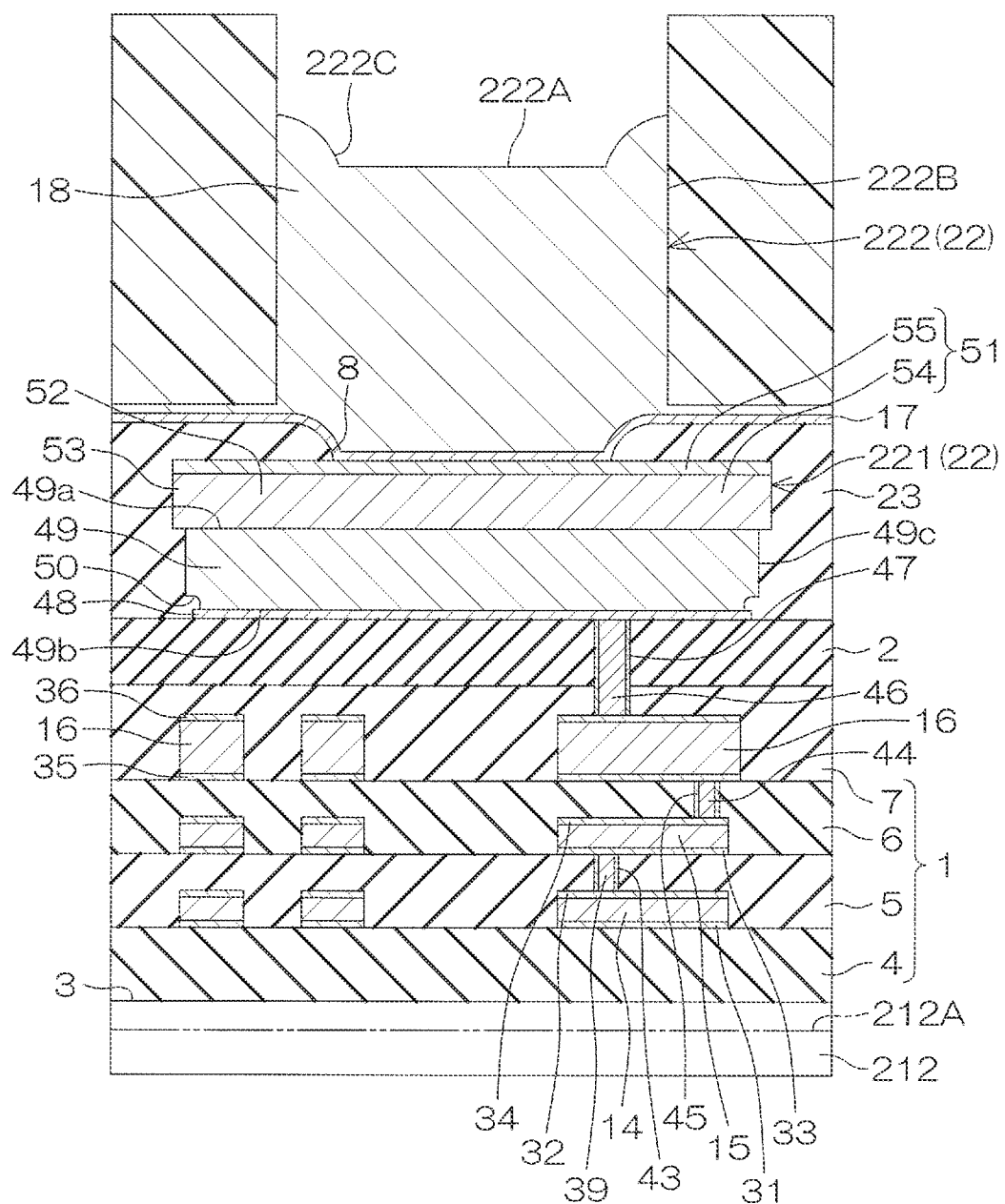
Figure 18L:
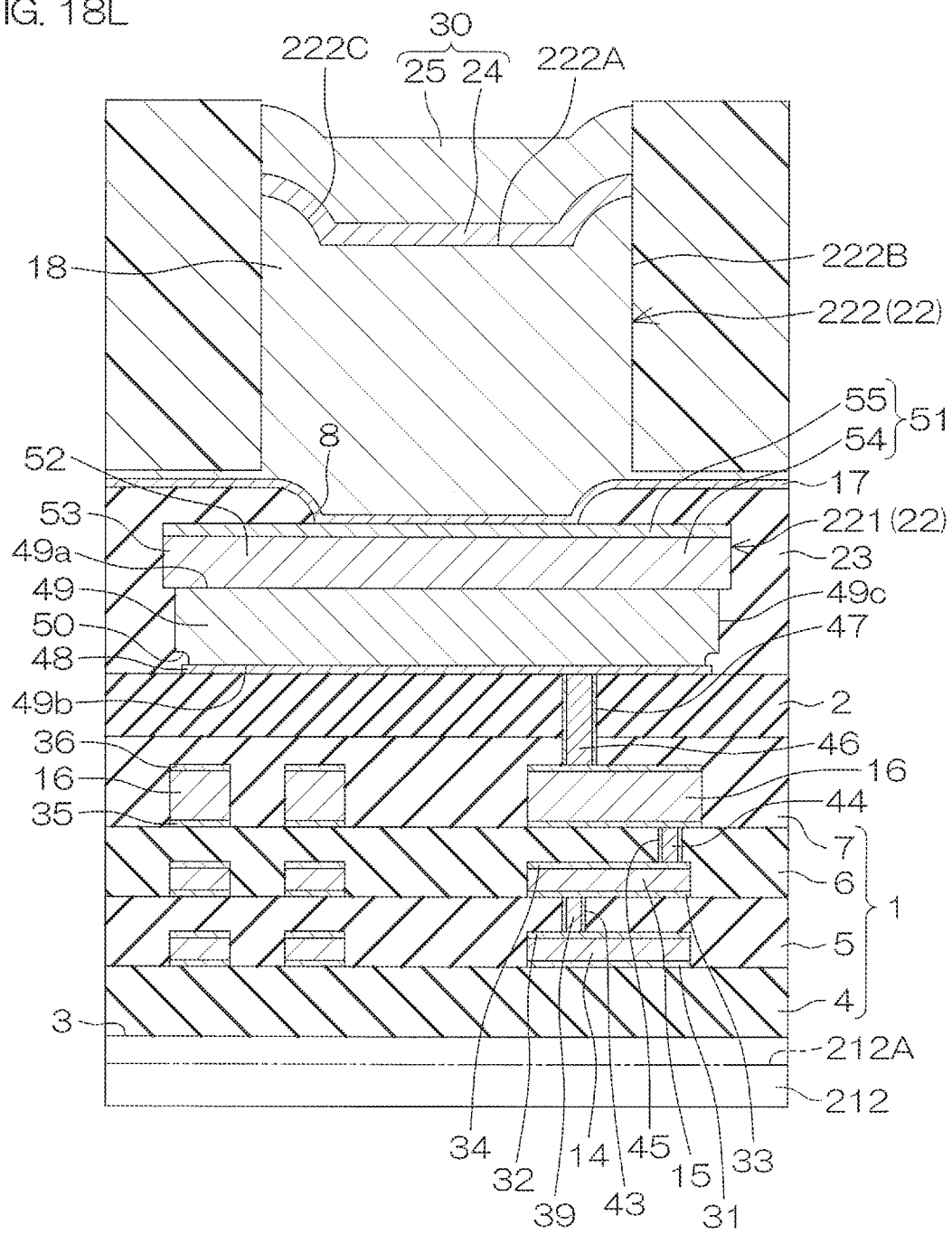
Figure 18M:
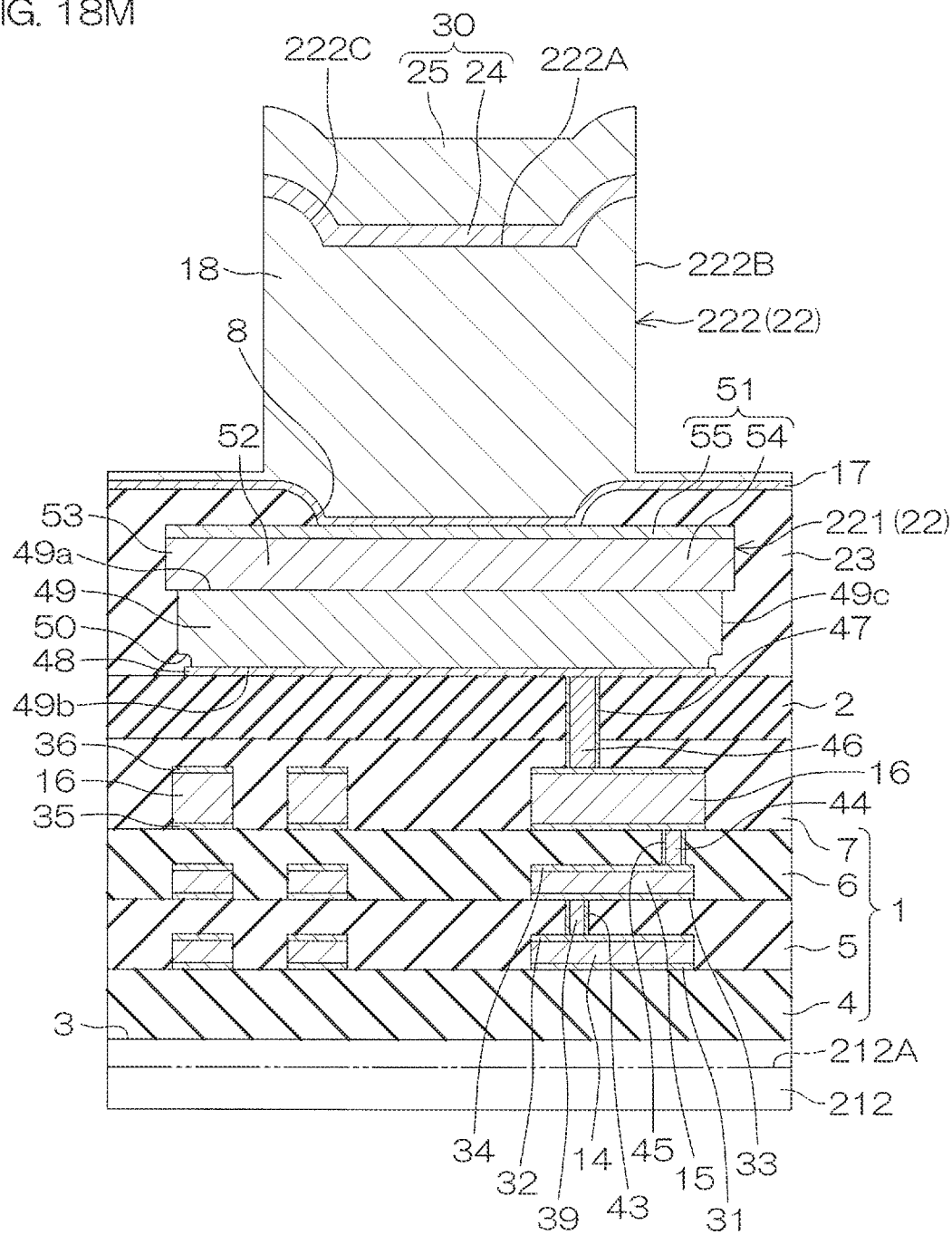
Figure 18N:
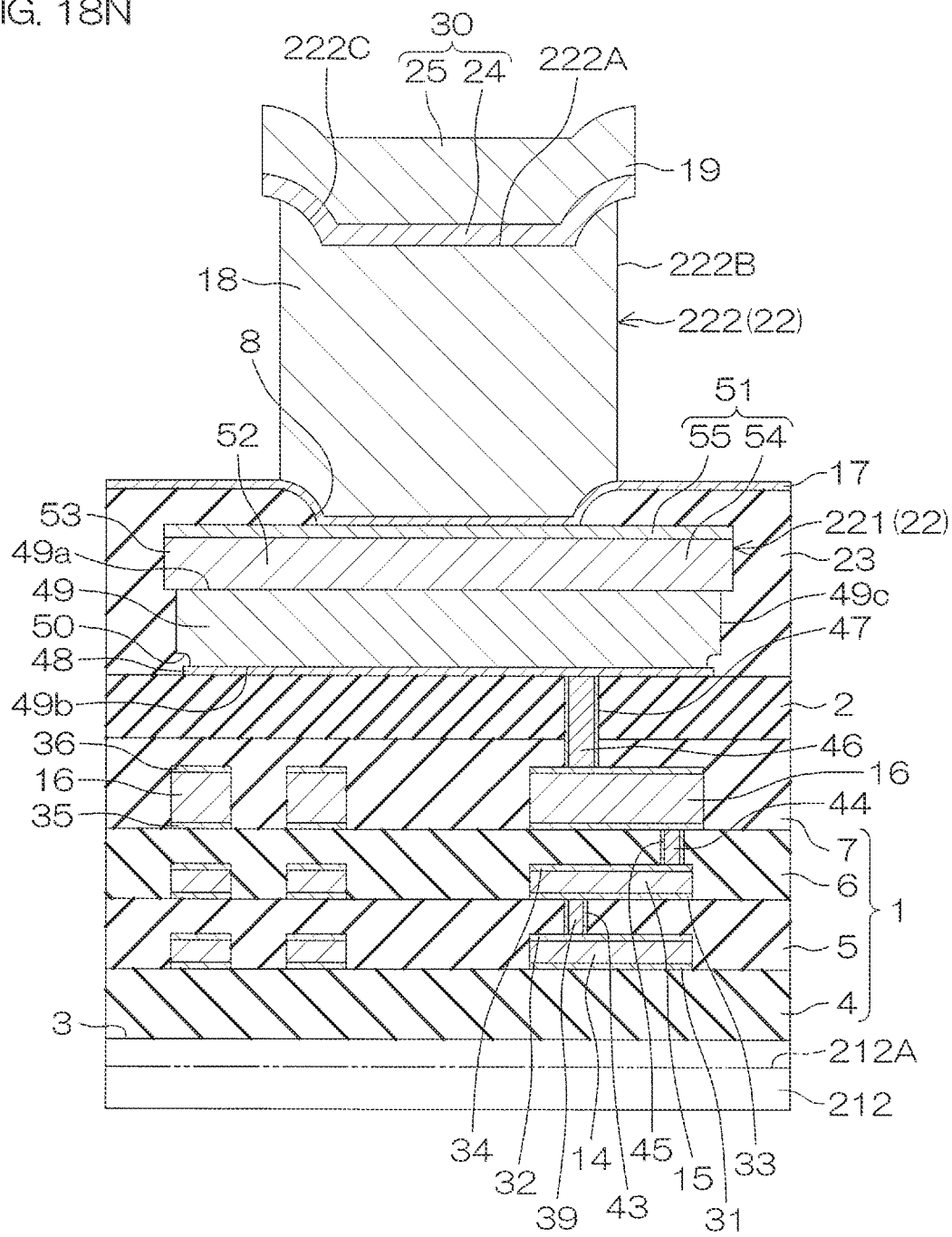
Figure 18O:
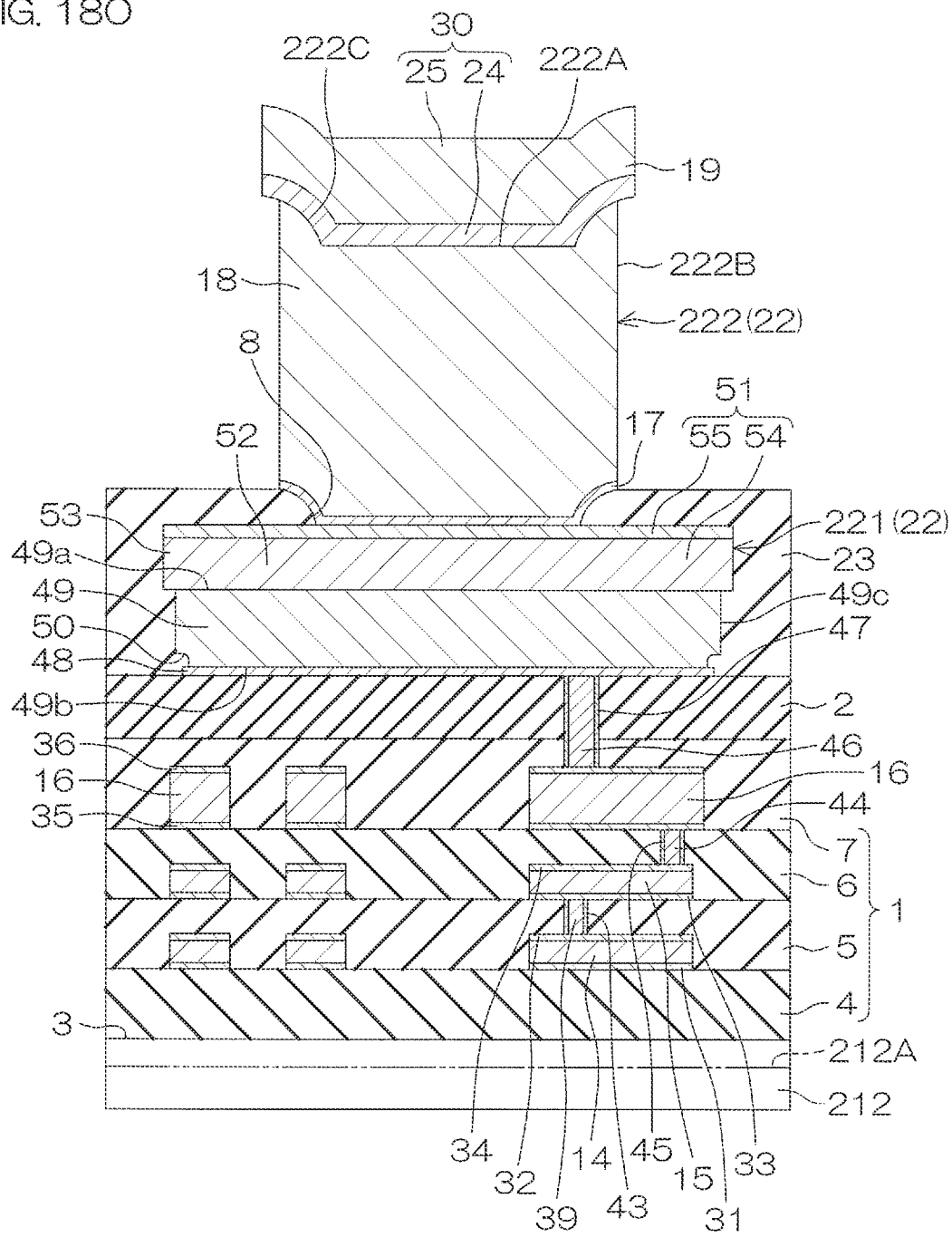
Figure 18P:
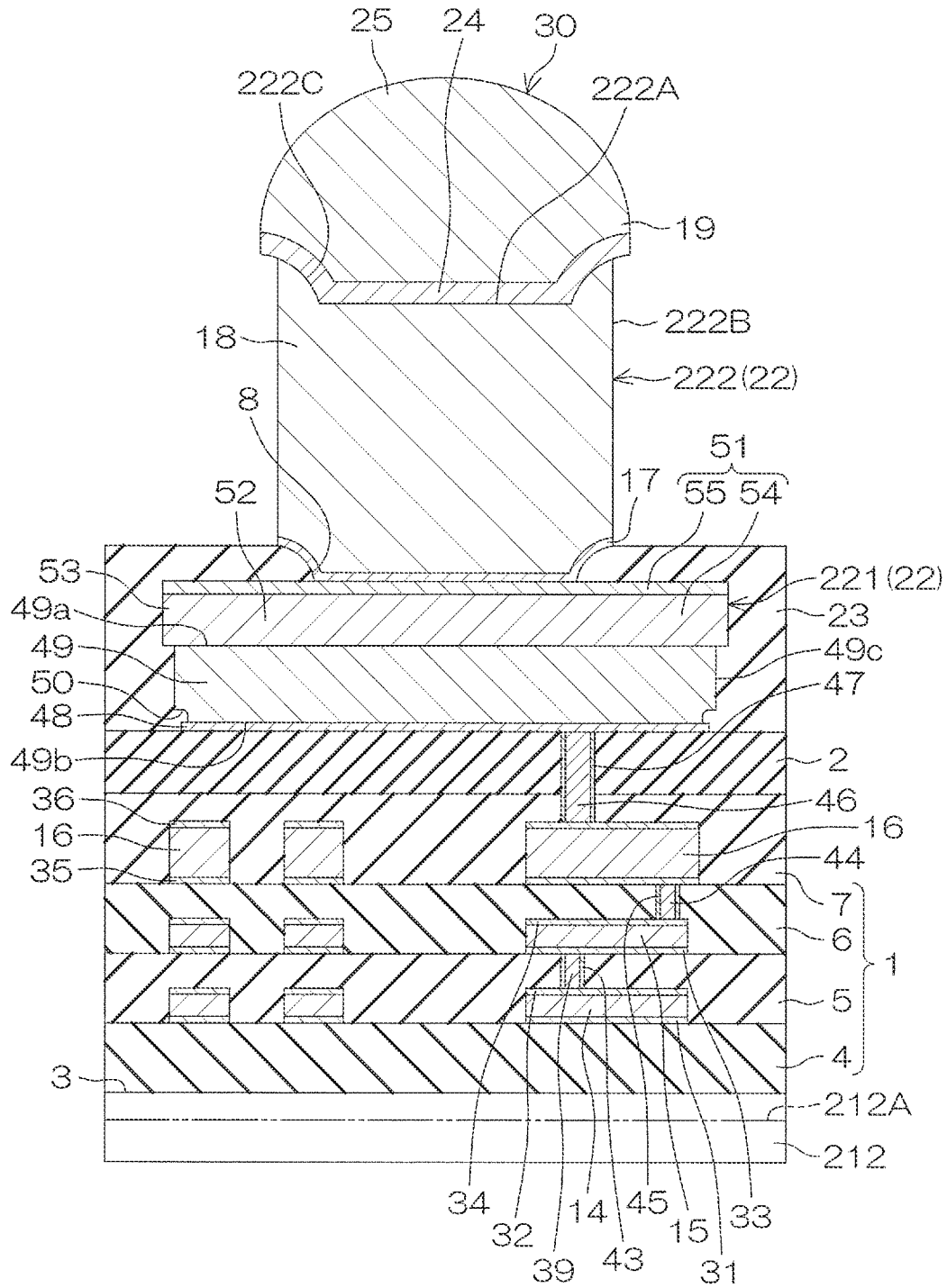

FIG. 18A to FIG. 18P are views to describe a part of a process for manufacturing the semiconductor package A10 in order of process steps. A case in which the Cu electrode layer 49 is made of high purity copper will be hereinafter described as an example.

To manufacture the semiconductor package A10, the semiconductor device 20 is first manufactured. Referring to FIG. 18A, the semiconductor substrate 211 (semiconductor layer 212) in which the passivation film 2 is formed on the multilayer wiring structure 1 is prepared. The third via 46 passing through the passivation film 2 and through the fourth interlayer insulating film 7 is formed in these films. Thereafter, the barrier electrode layer 48 is formed on the passivation film 2. The barrier electrode layer 48 may be formed according to, for example, a sputtering method.

Thereafter, referring to FIG. 18B, a Cu seed layer 9 is formed on the barrier electrode layer 48. The Cu seed layer 9 may be formed according to, for example, the sputtering method. Thereafter, a mask 26 having a predetermined pattern is formed on the Cu seed layer 9. The mask 26 selectively has an opening 26a that exposes a region in which the Cu electrode layer 49 (which additionally includes a Cu layer 84 in the aforementioned third example) is to be formed in the Cu seed layer 9.

Thereafter, referring to FIG. 18C, the Cu electrode layer 49 is formed. The Cu electrode layer 49 is formed on the surface of the Cu seed layer 9 exposed from the opening 26a of the mask 26. The Cu electrode layer 49 may be formed according to an electrolytic copper plating method. The Cu electrode layer 49 is formed to a halfway portion in the depth direction of the opening 26a of the mask 26. The Cu electrode layer 49 is formed integrally with the Cu seed layer 9.

Thereafter, referring to FIG. 18D, the first layer 54 and the second layer 55 are formed in this order on the upper surface 49a of the Cu electrode layer 49. The first layer 54 and the second layer 55 are both formed on the upper surface 49a of the Cu electrode layer 49 exposed from the opening 26a of the mask 26. The first layer 54 and the second layer 55 may be both formed according to an electroless plating method.

Thereafter, referring to FIG. 18E, the mask 26 is removed.

Thereafter, referring to FIG. 18F, a needless part of the Cu seed layer 9 is removed. The Cu seed layer 9 may be removed by wet etching. In this step, a part of the Cu electrode layer 49 is subjected to side etching. Therefore, the side surface 49c of the Cu electrode layer 49 is formed so as to be positioned further inward than the side surface of the pad electrode layer 51.

Hence, the pad electrode layer 51 is formed. The pad electrode layer 51 includes the first portion 52 that is mechanically and electrically connected to the upper surface 49a of the Cu electrode layer 49 and the second portion 53 that projects from the first portion 52 toward a lateral part of the barrier electrode layer 48.

Thereafter, referring to FIG. 18G, a needless part of the barrier electrode layer 48 is removed. The barrier electrode layer 48 may be removed by wet etching. In this step, in the barrier electrode layer 48 positioned directly under the Cu electrode layer 49, only an amount according to the thickness of the barrier electrode layer 48 is removed. Therefore, the side surface of the barrier electrode layer 48 is formed so as to be positioned further inward than the side surface 49c of the Cu electrode layer 49.

Thereafter, referring to FIG. 18H, a corner portion by which the lower surface 49b and the side surface 49c are connected in the Cu electrode layer 49 is removed. The corner portion of the Cu electrode layer 49 may be removed by wet etching. The wet etching step is performed until the principal surface of the barrier electrode layer 48 is exposed. Hence, the concave portion 50 by which the upper surface of the edge portion of the barrier electrode layer 48 is exposed is formed in a region on the lower-surface-49b side of the side surface 49c of the Cu electrode layer 49.

Thereafter, referring to FIG. 18I, the surface protection film 23 is formed on the passivation film 2 so as to cover the base portion 221. Thereafter, the surface protection film 23 is subjected to patterning, and, as a result, the opening 8 is formed in the surface protection film 23. Thereafter, the barrier layer 17 is formed on the surface protection film 23. The barrier layer 17 may be formed according to, for example, the sputtering method. Thereafter, a Cu seed layer 27 is formed on the barrier layer 17. the Cu seed layer 27 may be formed according to, for example, the sputtering method.

Thereafter, referring to FIG. 18J, a mask 28 having a predetermined pattern is formed on the Cu seed layer 27. The mask 28 selectively has an opening 28a that exposes a region in which the Cu pillar 18 is to be formed in the Cu seed layer 27.

Thereafter, referring to FIG. 18K, the Cu pillar 18 is formed. The Cu pillar 18 is formed on the surface of the Cu seed layer 27 exposed from the opening 28a of the mask 28. The Cu pillar 18 may be formed according to the electrolytic copper plating method. The Cu pillar 18 is formed to a halfway portion in the depth direction of the opening 28a of the mask 28. The Cu pillar 18 is formed integrally with the Cu seed layer 27. Additionally, the concave portion 222C of the Cu pillar 18 is formed by following the hollow of the opening 8 of the surface protection film 23.

Thereafter, referring to FIG. 18L, the first layer 24 (nickel layer) is formed on the Cu pillar 18. The first layer 24 is formed at an upper surface of the Cu pillar 18 exposed from the opening 28a of the mask 28. The first layer 24 may be formed according to the electroless plating method.

Thereafter, referring to FIG. 18M, the mask 28 is removed.

Thereafter, referring to FIG. 18N, a needless part of the Cu seed layer 27 is removed. The Cu seed layer 27 may be removed by wet etching. In this step, a part of the Cu pillar 18 is subjected to side etching. Therefore, the side surface 222B of the Cu pillar 18 is formed so as to be positioned further inward than the side surface of the first layer 24.

Thereafter, referring to FIG. 18O, a needless part of the barrier layer 17 is removed. The barrier layer 17 may be removed by wet etching.

Thereafter, referring to FIG. 18P, the spherical second layer 25 (solder layer) is formed on the first layer 24.

Thereafter, the semiconductor device 20 is flip-bonded to the conductive member 10. Thereafter, the semiconductor device 20 is sealed by a sealing resin 40 together with the conductive member 10. Thereafter, a dicing step of the sealing resin 40 is performed, and the semiconductor package A10 is cut out. Through these steps, the semiconductor package A10 is manufactured.

As described above, in the semiconductor device 20, the pad electrode layer 51 made of a material having a linear expansion coefficient smaller than that of the Cu electrode layer 49 and smaller than that of the Cu pillar 18 is formed between the Cu electrode layer 49 and the Cu pillar 18. More specifically, the pad electrode layer 51 has a laminated structure consisting of the first layer 54 made of a nickel layer and the second layer 55 made of a palladium layer. This makes it possible to reduce stress generated when the semiconductor device 20 is packaged by use of the Cu pillar 18.

Figure 19:
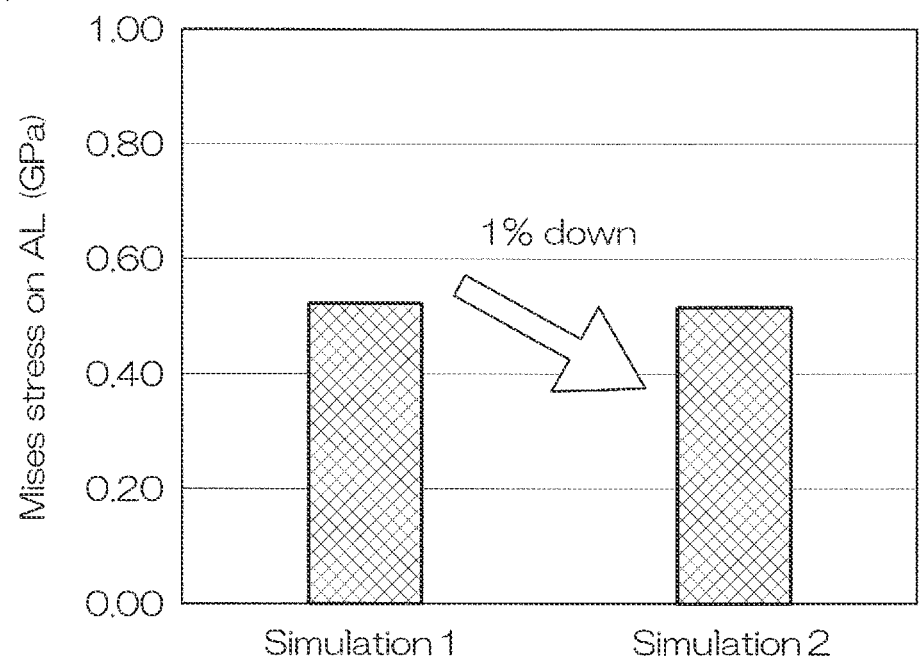
FIG. 19 is a view to describe a stress reduction effect obtained by the semiconductor device.
Figure 20:
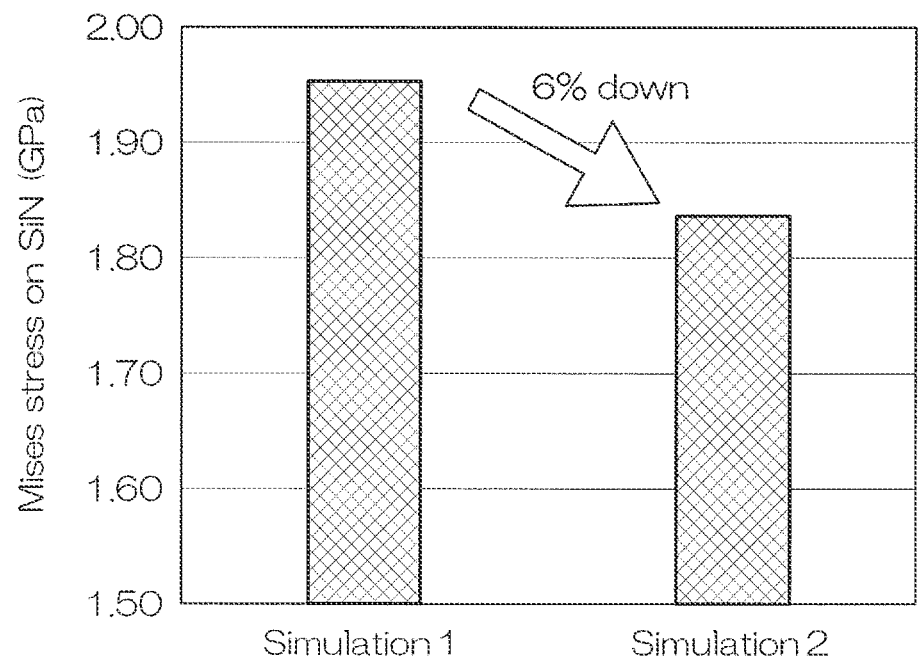
FIG. 20 is a view to describe a stress reduction effect obtained by the semiconductor device.

With respect to this point, stress reduction effects were verified by simulations. Results are shown in FIG. 19 and FIG. 20. Simulation 1 is different from simulation 2 in the structure of the Cu electrode layer 49 and the structure of the pad electrode layer 51.

More specifically, in simulation 1, the Cu electrode layer 49 was set at 7.25 µm in thickness, and the pad electrode layer 51 was set at 0 µm in thickness (i.e., there was no pad electrode layer). On the other hand, in simulation 2, the Cu electrode layer 49 was set at 4 µm in thickness, the nickel layer 54 was set at 3 µm in thickness, and the palladium layer 55 was set at 0.25 µm in thickness.

Additionally, Mises stress applied onto the third electrode layer 16 (in the simulation, aluminum) that is an uppermost layer wiring and Mises stress applied onto the passivation film 2 (in the simulation, SiN film) were simulated and verified. As a result, if the structure of simulation 2 is employed, Mises stress applied onto the third electrode layer 16 (aluminum) was reduced by approximately 1% (FIG. 19), and Mises stress applied onto the passivation film 2 (SiN) was reduced by as much as approximately 6% (FIG. 20). From this fact, it has been understood that it is possible to reduce stress generated when the semiconductor device 20 is packaged by use of the Cu pillar 18 if the structure of the semiconductor device 20 mentioned above is employed.

Particularly when the semiconductor device 20 is flip-chip packaged on the conductive member 10, stress is received from the Cu pillar 18 or from the conductive member 10, and therefore an excellent advantageous effect is fulfilled in flip chip packaging. This makes it possible to provide the semiconductor package A10 that is superior in reliability.

Although the preferred embodiment of the present invention has been described as above, the present invention can also be embodied in other modes.

For example, in the semiconductor device 20, the rear surface of the semiconductor substrate 211 may be bonded to the conductive member 10, and the lead of the pad electrode layer 51 and the lead of the conductive member 10 may be bonded by wire bonding although only a case in which the semiconductor device 20 is flip-chip bonded has been shown in the above preferred embodiment.

Besides, various design changes can be made within the scope of the subject matter described in the claims.

What is claimed is:
1. A semiconductor chip comprising:
a semiconductor layer having a first surface;
a first insulating layer formed at the first surface of the semiconductor layer;

a conductive layer formed on the first insulating layer, the conductive layer made of a metal mainly containing Cu;

a second insulating layer formed on the first insulating layer, the second insulating layer covering the conductive layer, the second insulating layer having an opening from which a part of the conductive layer is exposed;

a Copper pillar extending in a thickness direction such that the Copper pillar is formed over the second insulating layer and the conductive layer, the Copper pillar made of a metal mainly containing Cu and electrically connected to the conductive layer through the opening;

an intermediate layer formed between the conductive layer and the Copper pillar, the intermediate layer made of a material having a linear expansion coefficient smaller than a linear expansion coefficient of the conductive layer and smaller than a linear expansion coefficient of the Copper pillar; and a concave portion formed at one end surface of the Copper pillar, wherein the concave portion has a bottom surface opposed to the opening in the thickness direction and a side surface which extends upwardly in a convex arc shape from the bottom surface in a cross section, and wherein an acute angle between a tangent line of a surface of the convex arc shape and a surface of the concave portion becomes steeper as the tangent line becomes closer to a side edge of the Copper pillar in a cross section.

2. The semiconductor chip according to claim 1, wherein the Copper pillar has a height of 20 μm or more.

3. The semiconductor chip according to claim 2, wherein, in one cross section, the conductive layer has a width larger than a width of the Copper pillar.

4. The semiconductor chip according to claim 3, wherein side walls of the Copper pillar in the one cross section have portions which are formed in approximately straight shapes.

5. The semiconductor chip according to claim 4, wherein, in the one cross section, the Copper pillar has a thickness larger than a thickness of the conductive layer.

6. The semiconductor chip according to claim 5, wherein, in the one cross section, the second insulating layer has a thickness larger than the thickness of the conductive layer.

7. The semiconductor chip according to claim 6, wherein, in the one cross section, the convex arc shape includes a portion where an angle between tangent lines of a surface of the convex arc shape and the bottom surface gradually decreases with increasing distance from the bottom surface in a left-right direction.

8. The semiconductor chip according to claim 7, wherein the conductive layer includes a Copper conductive layer.

9. The semiconductor chip according to claim 7, wherein, in the one cross section, the bottom surface of the concave portion includes flat horizontal portion.

10. The semiconductor chip according to claim 7, wherein the linear expansion coefficient of the conductive layer and the linear expansion coefficient of the Copper pillar are each 16.0 to 18.0 ($10^{-6}$/° C.), and the linear expansion coefficient of the intermediate layer is 10.0 to 15.0 ($10^{-6}$/° C.).

11. The semiconductor chip according to claim 7, wherein the intermediate layer includes a laminated structure including a first intermediate layer and a second intermediate layer that are laminated first and second respectively from the conductive layer, and the first intermediate layer has a linear expansion coefficient larger than a linear expansion coefficient of the second intermediate layer, and has a thickness larger than a thickness of the second intermediate layer.

12. The semiconductor chip according to claim 11, wherein the first intermediate layer includes a Nickel (Ni) layer, and the second intermediate layer includes a Palladium (Pd) layer.

13. The semiconductor chip according to claim 7, wherein the thickness of the Copper pillar is 20 μm to 60 μm.

14. The semiconductor chip according to claim 7, wherein the thickness of the conductive layer is 2 μm to 6 μm.

15. The semiconductor chip according to claim 7, further comprising a bonding layer for external connection formed on the Copper pillar, the bonding layer having a layer made of a material having a linear expansion coefficient smaller than the linear expansion coefficient of the Copper pillar at a part that is contiguous to the Copper pillar.

16. The semiconductor chip according to claim 15, wherein the bonding layer includes an external bonding layer that is used for flip chip bonding.

17. The semiconductor chip according to claim 15, wherein the bonding layer includes a first layer that is formed on the Copper pillar and that is made of a metal mainly containing Ni and a second layer that is formed on the first layer and that is made of a metal mainly containing solder, and the second layer is used for external connection.

18. The semiconductor chip according to claim 17, wherein the second layer is formed in a substantially spherical shape.

19. The semiconductor chip according to claim 7, further comprising a barrier layer formed between the first insulating layer and the conductive layer, the conductive layer having a first surface and a second surface that is contiguous to the barrier layer, a circumferential edge on a second-surface side of the conductive layer being away from a circumferential edge of the barrier layer toward an inward side of the barrier layer.

20. A semiconductor device comprising:

a conductive member having a first surface and a second surface on an opposite side of the first surface;

the semiconductor chip according to claim 7, flip-chip bonded to the first surface of the conductive member; and a sealing resin covering a part of the conductive member and the semiconductor chip.

21. A semiconductor device comprising:

a conductive member having a first surface and a second surface on the opposite side of the first surface;

the semiconductor chip according to claim 7, mounted on the first surface of the conductive member and in which the Copper pillar is connected to the first surface of the conductive member; and a sealing resin covering a part of the conductive member and the semiconductor chip.

22. A semiconductor device comprising:

a conductive member having a first surface and a second surface on an opposite side of the first surface;

the semiconductor chip according to claim 7, mounted on the first surface of the conductive member and in which the Copper pillar is connected to the first surface of the conductive member;

a bonding material that is formed between the conductive member and the Copper pillar and that is made of a metal mainly containing solder; and a sealing resin covering a part of the conductive member, the semiconductor chip, and the bonding material.

23. The semiconductor device according to claim 22, wherein a part of the Copper pillar is buried in the bonding material.

24. The semiconductor chip according to claim 1, wherein the Copper pillar has a height in a first direction of a thickness of the semiconductor chip and a width in a second direction perpendicular to the first direction, and the height of the Copper pillar is larger than the width of the Copper pillar.

25. The semiconductor chip according to claim 6, wherein the convex arc shape is formed conforming to the surface shape of the second insulating layer in the cross section.

* * * * *